(12) United States Patent
Akedo et al.

(10) Patent No.: US 10,212,822 B2
(45) Date of Patent: Feb. 19, 2019

(54) STRUCTURE FORMED ON SUBSTRATE, STRUCTURE MANUFACTURING METHOD AND LINE PATTERN

(71) Applicant: NATIONAL INSTITUTE OF ADVANCED INDUSTRIAL SCIENCE AND TECHNOLOGY, Tokyo (JP)

(72) Inventors: Jun Akedo, Tsukuba (JP); Akito Endo, Tsukuba (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 0 days.

(21) Appl. No.: 15/717,029

(22) Filed: Sep. 27, 2017

(65) Prior Publication Data
US 2018/0020553 A1   Jan. 18, 2018

Related U.S. Application Data

(63) Continuation of application No. 14/700,742, filed on Apr. 30, 2015, now Pat. No. 9,807,887, which is a
(Continued)

(30) Foreign Application Priority Data

Oct. 30, 2012  (JP) .................................. 2012-239520

(51) Int. Cl.
*H05K 3/12* (2006.01)
*H05K 1/02* (2006.01)

(52) U.S. Cl.
CPC ........... *H05K 3/125* (2013.01); *H05K 1/0296* (2013.01); *H05K 3/1241* (2013.01)

(58) Field of Classification Search
CPC .... H05K 3/125; H05K 3/1241; H05K 3/4664; H05K 1/0296
(Continued)

(56) References Cited

U.S. PATENT DOCUMENTS

2005/0037614 A1   2/2005 Fukuchi
2005/0116069 A1   6/2005 Murata
(Continued)

FOREIGN PATENT DOCUMENTS

JP   2004-165587 A   6/2004
JP   2006-66494 A    3/2006
(Continued)

OTHER PUBLICATIONS

International Search Report dated on Jan. 14, 2014 regarding International Patent Application No. PCT/JP2013/078916. English translation of ISR is attached.
(Continued)

*Primary Examiner* — Steven T Sawyer
(74) *Attorney, Agent, or Firm* — Hauptman Ham, LLP

(57) ABSTRACT

Provided are a structure for which ink wettability/spreadability in the width direction of a line drawn on a substrate is limited and a high aspect ratio can be achieved, a manufacturing method for said structure, and a line pattern. The present invention provides a structure comprising: a droplet overlapping solidification layer obtained by droplets sloping and continuously overlapping each other in the direction of movement of a substrate and solidifying, a droplet flow solidified layer obtained by the droplets flowing on the droplet overlapping solidification layer and continuously being solidified without the droplets overlapping, and recesses formed at the boundary region between the droplet overlapping solidification layer and the droplet flow solidified layer.

5 Claims, 23 Drawing Sheets

Related U.S. Application Data continuation of application No. PCT/JP2013/078916, filed on Oct. 25, 2013.

(58) Field of Classification Search
USPC .......................................................... 174/257
See application file for complete search history.

(56) References Cited

U.S. PATENT DOCUMENTS

| | | |
|---|---|---|
| 2006/0045962 A1 | 3/2006 | Miura |
| 2007/0128855 A1 | 6/2007 | Cho et al. |
| 2010/0035375 A1* | 2/2010 | Grigoropoulos ...... H01L 21/288 438/99 |
| 2010/0224392 A1 | 9/2010 | Okamori |
| 2010/0302319 A1 | 12/2010 | Akedo et al. |
| 2013/0201240 A1 | 8/2013 | Kodama |
| 2014/0063111 A1 | 3/2014 | Kakinuma et al. |

FOREIGN PATENT DOCUMENTS

| | | |
|---|---|---|
| JP | 2006-239899 A | 9/2006 |
| JP | 2008-500151 A | 1/2008 |
| JP | 2009-101356 A | 5/2009 |
| JP | 2012-206421 A | 10/2012 |
| JP | 2014-46254 A | 3/2014 |
| WO | 96/01156 A1 | 1/1996 |
| WO | 2005/115637 A1 | 12/2005 |
| WO | 2009072603 A1 | 6/2009 |
| WO | 2012036232 A1 | 3/2012 |

OTHER PUBLICATIONS

International Preliminary Report on Patentability dated May 5, 2015 regarding PCT application No. PCT/JP2013/078916. Written Opinion dated Jan. 14, 2014 is included.

Chinese Office Action dated Jun. 1, 2016 for the counter Chinese Application No. 201380056926.6, citing the above reference(s).

Decision to grant a patent dated Jul. 26, 2016 for the counter Japanese Application No. 2014-544471, citing the above reference(s).

Decision to grant dated Mar. 28, 2017 for Japanese Application No. 2016-058271, citing the above reference(s).

Taiwanese Office Action dated Apr. 11, 2017 for Taiwanese Patent Application No. 102139340.

* cited by examiner

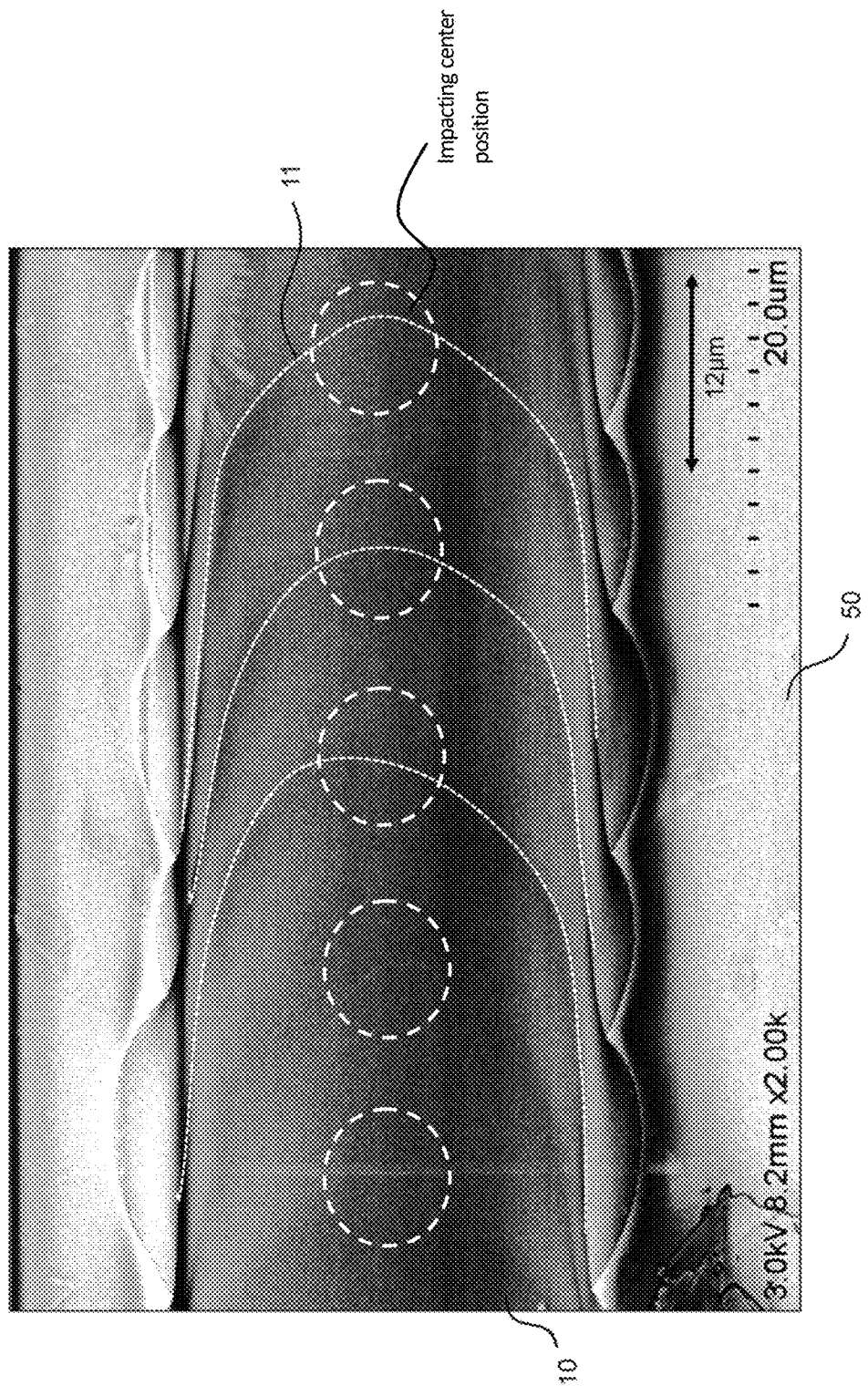

20

21

STRUCTURE FORMED ON SUBSTRATE, STRUCTURE MANUFACTURING METHOD AND LINE PATTERN

CROSS REFERENCE TO RELATED APPLICATIONS

This application is a continuation of U.S. patent application Ser. No. 14/700,742, filed on Apr. 30, 2015, which is based upon and claims the benefit of priority from the prior Japanese Patent Application No. 2012-239520, filed on Oct. 30, 2012 and PCT Application No. PCT/JP2013/078916, filed on Oct. 25, 2013, the entire contents of which are incorporated herein by reference.

FIELD

The present invention relates to a structure formed on a substrate, a manufacturing method of a structure and a line pattern structure. In particular, the present invention relates to a structure formed on a substrate by ejecting ink, a manufacturing method of the structure and a line pattern of the structure.

BACKGROUND

In electrical and electronic equipment, not only high performance, miniaturization and cost is required but also design and manufacturing technology suitable for product diversification and shortening of the product cycle. However, generally in fine patterning of a film formed by masking and etching using a photolithography of a metal or non-metallic material thin film, the process becomes complicated, flexibility of the pattern is limited, and It is difficult to form a continuous pattern on a site with large steps, and the etching rate in the case of a non-metallic material is slow, damage is caused to the substrate or device structure and there are many manufacturing problems such as the durability of the mask material caused by an etching gas due to high etching temperatures.

In recent years, a method has been developed in which a raw material such as metal nanoparticle ink or a metal alkoxide solution was dropletized using an inkjet method, directly drawn on a substrate to form a fine pattern, then, by applying a heat treatment or the like, a metal or ceramic film fine structure is formed without performing an etching step. By making the droplets small, a structure with a line width of about 1 μm can be formed.

In this method, it is necessary to crystallize a fine pattern formed on the substrate by a heat treatment because the pattern before a heat treatment is not crystallized or metallized. However, when a heat treatment is performed once after stacking a film, cracks and peeling occur which makes it difficult to stably produce a device due to shrinkage of the film caused by crystallization, and because it is necessary to repeat deposition in the same location every time in order to obtain a film thickness, it is difficult to form a thick film structure at high speed.

In a conventional ink jet method, droplets are spread due to a capillary effect caused by wettability of a substrate material due to surface tension and surface roughness of the substrate when the droplets impact on the substrate, and because line width becomes several times more than the diameter of a droplet, fine drawing becomes even more difficult. In order to overcome this, for example, a fine inkjet technology is described in Japanese Laid Open Patent 2004-165587 in which the nozzle aperture size is miniaturized to 10 μm or less, and by making the size of the discharged liquid droplets $1/1000$ or less in volume using electric field absorption, and it is possible to obtain fine drawing with a micron-sized width.

However, in the technology of Japanese Laid Open Patent 2004-165587, because the droplet size is very small, the supply of a material per nozzle onto a substrate becomes an extremely small amount, the film thickness in a single drawing is about several tens of nm, and in order to obtain a thickness of more than a few microns, recoating more than several tens of times is required. Therefore, there were practical problems such that a longer manufacturing time is required and a practical throughput cannot be obtained, and clogging of the nozzle is caused because the nozzle is miniaturized.

However, for example, a technology is described in Japanese Laid Open Patent 2009-101356 in which the time the droplet diameter of fine droplets of ink deposited on a substrate reaches the maximum allowed droplet size is set as the allowable elapsed time, and from the time of impact to when the allowable elapsed time elapses, the fine droplets which have impacted on the substrate are set to a scanning speed for moving to an irradiation position from the impact position, and when the allowable elapsed time elapses from the time of impact, when the fine droplets impacted are located at the irradiation position, the shape of the structure to be formed by irradiating a laser beam is controlled. However, the technology described in Japanese Laid Open Patent 2009-101356, in order to irradiate a laser beam onto fine droplets when they impact a substrate, when the laser heat is insufficient, the droplet is not sufficiently dried or solidified, and when the power of the laser is strong, fine holes or irregularities may be produced that are considered to cause a bumping phenomenon of the ink, optimization of the conditions is difficult, and miniaturization of the structure becomes more difficult.

SUMMARY

The present inventions is intended to solve the problems described above by providing a structure which can suppress wetting and spreading of an ink in the width direction of drawn lines on a substrate and realize a high aspect ratio, a manufacturing method of the structure and a line pattern.

According to one embodiment of the present invention, a structure is provided including a droplet overlapping solidification layer obtained by droplets inclining in the direction of movement of a substrate and continuously overlapping each other and solidifying, a droplet flow solidified layer obtained by the droplets flowing on the droplet overlapping solidification layer and continuously being solidified without the droplets overlapping, and a recessed part formed at the boundary region between the droplet overlapping solidification layer and the droplet flow solidified layer.

In the structure, the droplet overlapping solidification layer may be arranged with a convex part formed by continuously inclining in the direction of movement of the substrate.

In the structure, an aspect ratio of the structure may be 0.1 or more.

The structure may have an angle of 5 degrees or more with respect to a surface of the substrate.

In the structure, the droplet flowing solidification layer may be formed by dispersion of metal particles, and the metal particles appear dispersed on a surface of the droplet flowing solidification layer.

In addition, according to one embodiment of the present invention, a method of manufacturing a structure is provided including irradiating light to a moving substrate, forming a temperature profile having a peak temperature on an upstream side in the moving direction of the substrate, and impacting droplets on to a temperature region becoming a low temperature on a downstream side in the moving direction of the substrate from the peak temperature of the temperature profile.

In the method of manufacturing the structure, a temperature gradient in the temperature region becoming the low temperature on the downstream side in the moving direction of the substrate may be 1° C./mm or more and 100° C./mm or less.

In the method of manufacturing the structure, the temperature profile may be a non-Gaussian distribution In the method of manufacturing the structure, the temperature profile may be a hat shape or double hump shape temperature distribution formed by making the temperature profile of the non-Gaussian distribution rotate around the center of a droplet landing position above the moving substrate.

In the method of manufacturing the structure, the temperature profile may be defined by an input power of the light, a thermal conductivity of the substrate, a heat capacity and a moving speed.

In addition, according to one embodiment of the present invention, a line pattern is provided with the structure according to any one of the above.

The line pattern may be arranged with a width of 0.5 μm or more and an aspect ratio of 0.1 or more.

BRIEF EXPLANATION OF THE DRAWINGS

FIG. 2A is a top view of the structure 10;

FIG. 3A is a top view of the structure 10;

FIG. 4B shows an SEM image of a structure related to one embodiment of the present invention, indicating impacting center positions by dotted circles;

FIG. 8A is a schematic diagram showing a droplet 20 that has solidified on a stationary substrate;

FIG. 13A shows an SEM image of the droplets solidified on the substrate discharged in a cycle of 50 Hz;

FIG. 14A shows is a SEM image of the structure 90 formed with a temperature gradient of less than 1° C./mm;

EXPLANATION OF THE REFERENCE SYMBOLS

Figure 1A:
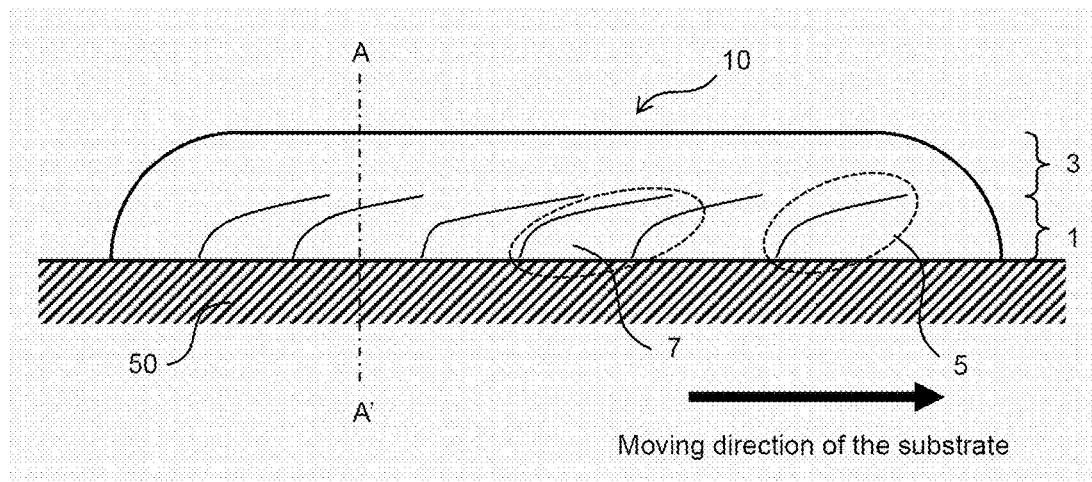
FIG. 1A shows a schematic view of a side view of a structure 10 related to one embodiment of the present invention.

1: droplet overlapping solidified layer, 3: droplet flow solidified layer, 5: recess, 7: convex part, 10: structure, 11:

scaly shape, 20: droplet, 21: droplet, 23: impacting center position, 15: solute being solidified, 50: structure, 90: structure, 95: structure, 91: solution, 93: impacting center position, 100: structure manufacturing device, 101: irradiated region, 103: droplet impacting position, 110 heating part, 120: discharge part, 130: temperature measurement part, 150: moving part

DESCRIPTION OF EMBODIMENTS

Below, a structure formed on a substrate according to the present invention, a manufacturing method and a line pattern of the structure is described with reference to the drawings. However, the structure which is formed on the substrate of the present invention, a manufacturing method and line pattern of the structure are not to be interpreted as being limited to the description of the embodiments and examples described below. In the drawings to be referred to in the embodiments and examples of the present invention, the same parts or parts having similar functions are denoted by the same reference numerals and repeated descriptions thereof will be omitted.

As a technique for solving the above problems, the present inventors have disclosed a technology in International Publication WO2009/072603 in which in a pattern formation method including forming a wiring pattern or a functional film pattern above a substrate by impacting a droplet on the substrate and, before the drawing step, heating in advance by irradiating a laser or infrared rays on the droplet impact position where the droplets impact on the substrate. The technology disclosed by the inventors show for the first time that it is possible to suppress spreading of ink by controlling the moving speed of the substrate, the discharge cycle of a droplet and the heating of a droplet impact position and achieve a desired structure with a high aspect ratio, that is, form a structure with certain thickness.

Before the droplets impact, the outside diameter of the droplet is made a target outside diameter by irradiating a laser onto a structure forming position in advance to raise the temperature of the substrate while maintaining the shape of the substrate is described in Japanese Laid Open Patent 2009-101356. However, in Japanese Laid Open Patent 2009-101356, since the relationship between the rise in a local temperature of the substrate due to the laser beam being irradiated onto a substrate and the structure formed by impacting droplets has not been studied sufficiently, irradiation of a laser beam is merely pre-heating and it is difficult to form a structure with a certain thickness.

The present inventors have conducted extensive studies in order to further optimize the technique disclosed in International Publication WO2009/072603 as described above. As a result, in order to suppress wetting and spreading of ink in the width direction of a drawing line on a substrate and form a structure which can realize a high aspect ratio, it was found that it is necessary to form a certain temperature distribution in a region of a substrate surface on which ink impacts and complete the present invention.

Figure 1B:
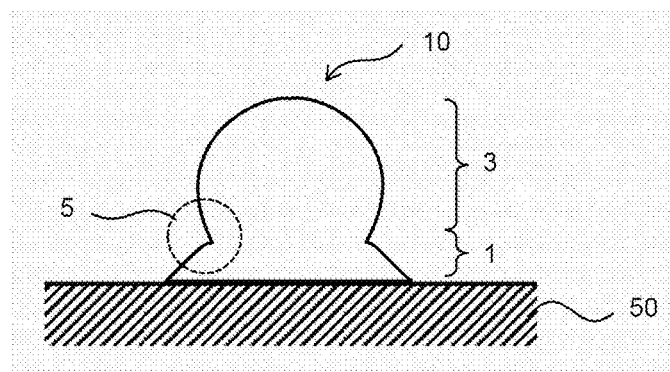
FIG. 1B shows a schematic view of a partial view of a structure 10 related to one embodiment of the present invention in the AA' of FIG. 1A.

FIG. 1 shows a schematic view of a structure 10 related to one embodiment of the present invention, FIG. 1A is a side view of the structure 10, and FIG. 1B is a cross-sectional view of the structure 10 in AA' in FIG. 1A. Structure 10 related to the present embodiment is arranged with a droplet overlapping solidified layer 1 in which droplets incline in the moving direction of the substrate 50, the layer being formed by droplets continuously overlapping and solidifying, a droplet flow solidified layer 3 formed when droplets flow over the droplet overlapping solidified layer 1 but solidify continuously without overlapping, and recessed parts 5 formed at the boundary region between the droplet overlapping solidified layer 1 and the droplet flowing solidified layer 3. In addition, in the structure 10, the droplet overlapping solidified layer 1 is arranged with a convex part 7 is formed to be inclined continuously in the moving direction of the substrate 50 side part.

Figure 2A:
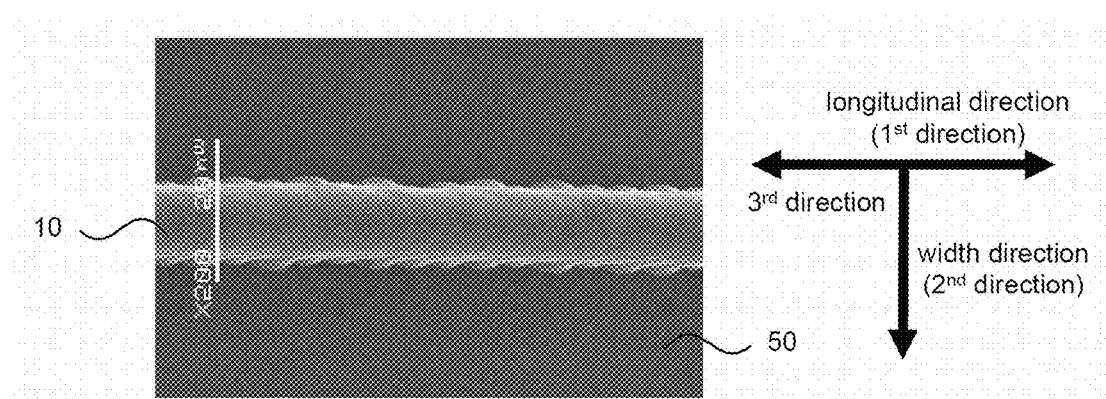
FIG. 2A shows an SEM image of a structure related to one embodiment of the present invention.
Figure 2B:
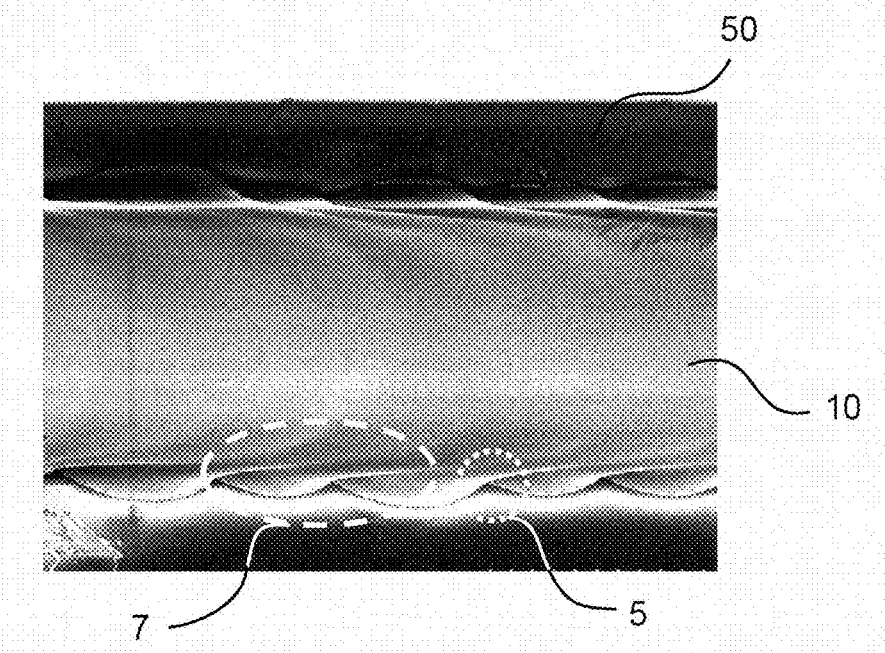
FIG. 2B shows an enlarged view of FIG. 2A.
Figure 2C:
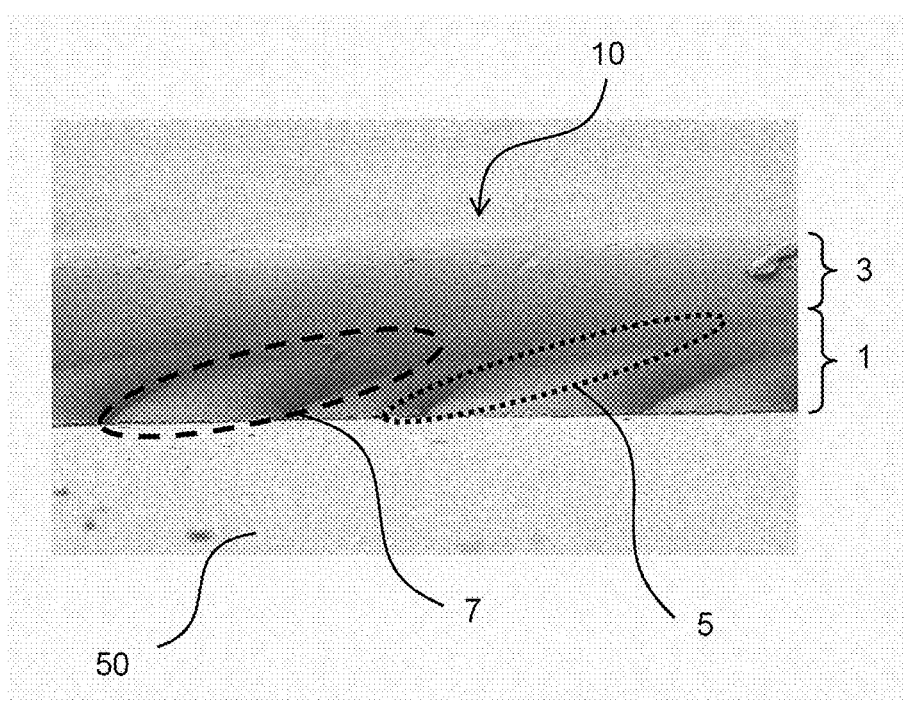
FIG. 2C shows a side view of the structure 10.

FIG. 2A to 2C are scanning electron microscope (SEM) images of the structure 10 related to the present embodiment formed on a substrate. FIG. 2A is a top view of the structure 10, FIG. 2B is an enlarged view thereof and FIG. 2C is a side view of the structure 10. As described above, the structure 10 related to the present embodiment is a pattern arranged consecutively on the substrate 50. The structure 10 includes a line shaped recessed part 5 which inclines from the bottom of the structure 10 in contact with the substrate 50 toward the top of the structure 10 roughly parallel with the substrate 50 in a roughly parallel longitudinal direction (first direction) with the substrate 50. In addition, the structure 10 includes a convex shaped part 7 that extends toward to the width direction (second direction) roughly perpendicular to the first direction and a third direction opposite to the first direction.

Figure 3A:
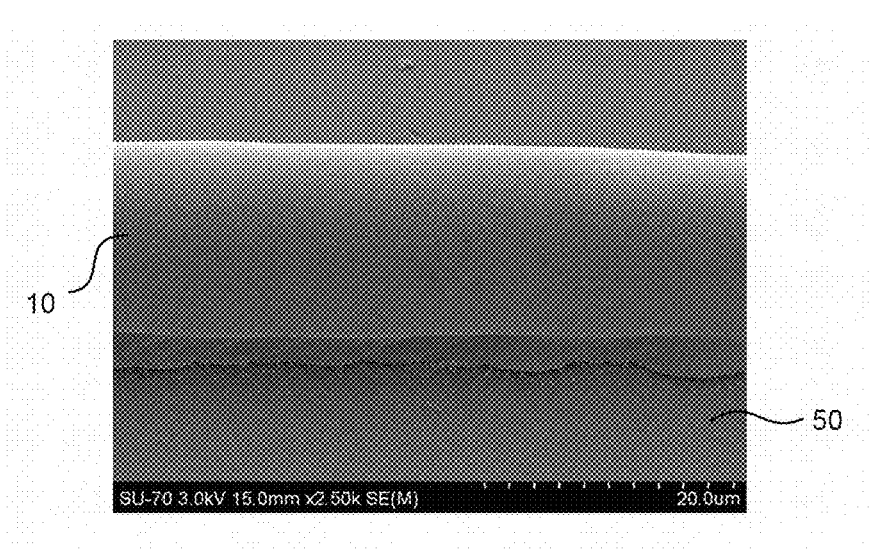
FIG. 3A shows an SEM image of a structure related to one embodiment of the present invention.
Figure 3B:
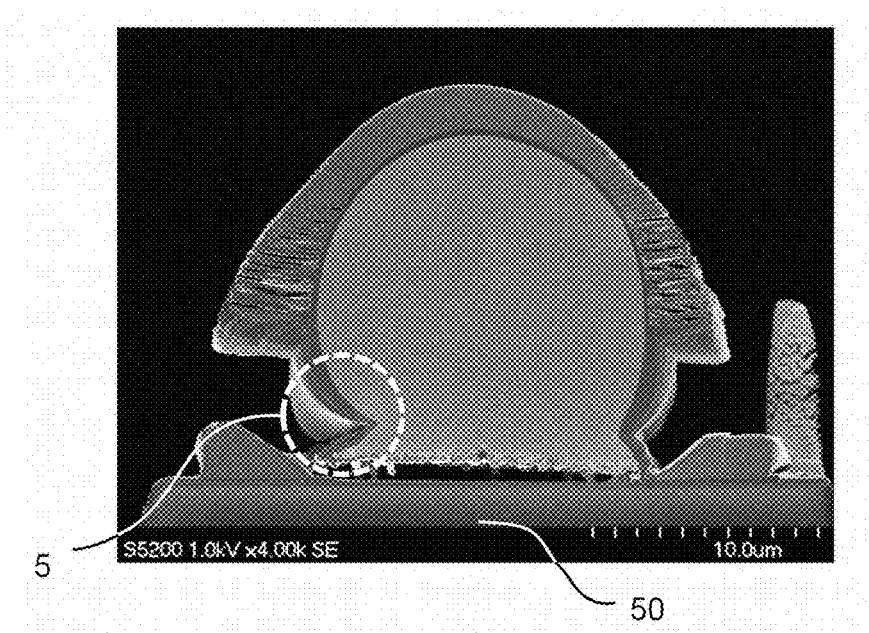
FIG. 3B shows a cross-sectional view of FIG. 3A.
Figure 3C:
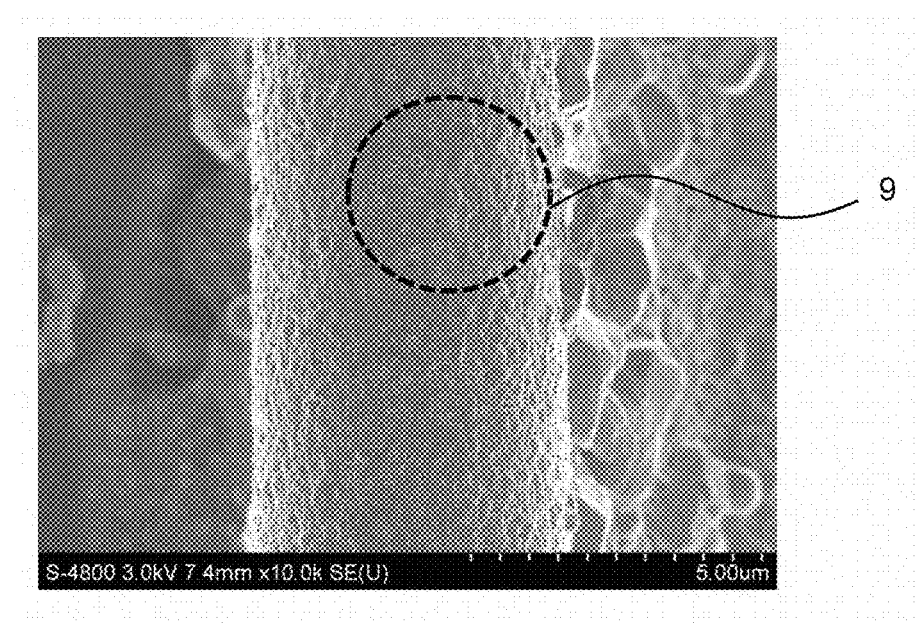
FIG. 3C shows an enlarged diagram of the upper surface of the structure 10.
Figure 4A:
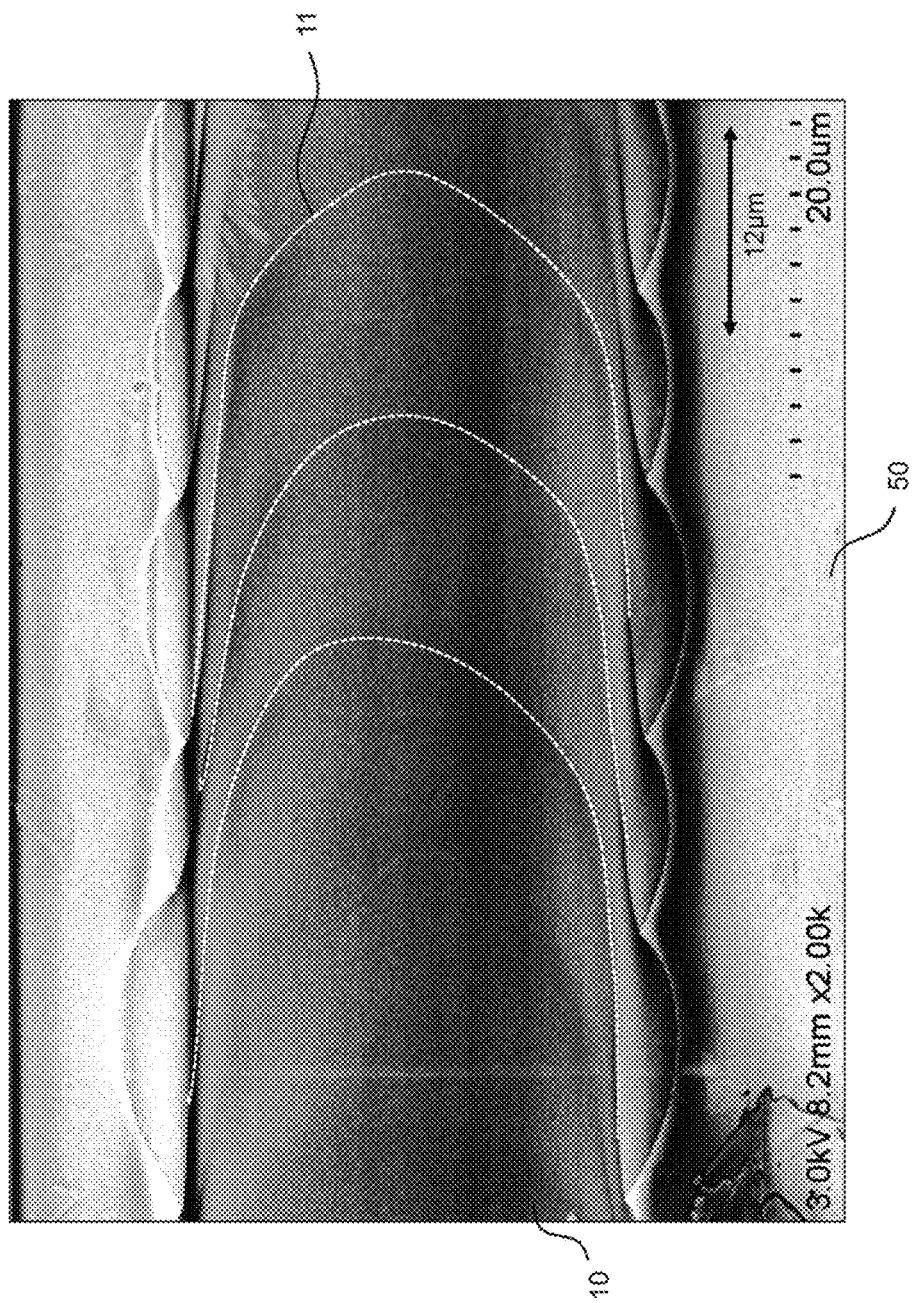
FIG. 4A shows an SEM image of a structure related to one embodiment of the present invention.

FIG. 3A to 3C show SEM images of a structure related to one embodiment of the present invention, FIG. 3A is a top view of the structure 10. As is shown in FIG. 3B, the structure 10 includes a recessed part 5 along the first direction of the structure 10 in the vicinity of the side surface along the first direction of the structure 10 in contact with the substrate 50, and when cutting so as to intersect to the first direction, the cross part has an inverted tapered shape such as a mushroom. In addition, in the structure 10 related to the present embodiment, the droplet flow solidified layer 3 is formed by dispersing metal fine particles and the metal fine particles are dispersed and appear on the surface of the droplet flow solidified layer 3. Therefore, in the case where the material such as metal which is crystallized is used as a solute of the droplet, when the structure 10 expands, it is possible to observe the particulate shaped structure 9 as shown in FIG. 3C. This indicates that the structure 10 has a polycrystalline structure. Furthermore, as is shown in FIG. 4A, a scaly shape 11 which becomes a convex in a first direction at the top of the structure is observed in the structure 10.

The structure 10 related to the present embodiment having these type of characteristics is to suppress the wetting and spreading of ink in the width direction of the strokes above the substrate 50 making it possible to achieve a high aspect ratio. The reason for the structure 10 having a scaly shaped convex shaped part 7 is that the solution of the droplet that impacts on the substrate 50 is vaporized and solute is solidified, and by overhanging on the solute previously impacted and being gradually solidified, it is inferred to be due to solidifying so as to be compatible with the solute previously solidified. Therefore, in the structure 10 of the present embodiment, although the shape becomes close to a droplet since it solidifies quickly in the part in contact with the substrate 50, by solidifying gradually at the top part, a smooth continuous homogeneous structure is formed.

Therefore, in the structure 10 of the present embodiment, by controlling the temperature gradient formed on the substrate 50, and without drying immediately ink droplets that have impacted on the substrate 50, by utilizing the flow of ink droplets on substrate 50, the unevenness of the impacted ink droplets which are dried and overlap in the conventional ink jet method are smoothed out, and a drawing pattern has a smooth surface and a side surface shape.

When the temperature of the substrate 50 at the position where the droplets have impacted is too high, the droplets become a bumpy and the solute becomes a fragmented shape, and it is not possible to form a smooth continuous structure such as the structure 10 related to the present embodiment. On the other hand, when the temperature of the substrate 50 at the position where the droplets has impacted is too low, the viscosity of the droplets is reduced and spread on the substrate 50. Therefore, in the present invention, it is important to control the viscosity and flow of the droplets when they impact on the substrate 50 and the temperature distribution of the substrate 50 at the position where the droplets have impacted becomes significant.

In this way, as described below, the structure 10 related to the present embodiment formed by controlling the viscosity of the droplets can be realized with a high aspect ratio of 0.1 or more between the thickness and the line width of the structure. In addition, the angle of the side surface of a continuously formed structure 10 can be formed at 5 degrees or more with respect to the substrate surface and can preferably be formed at 17 degrees or more.

(Structure Manufacturing Apparatus)

Figure 5:
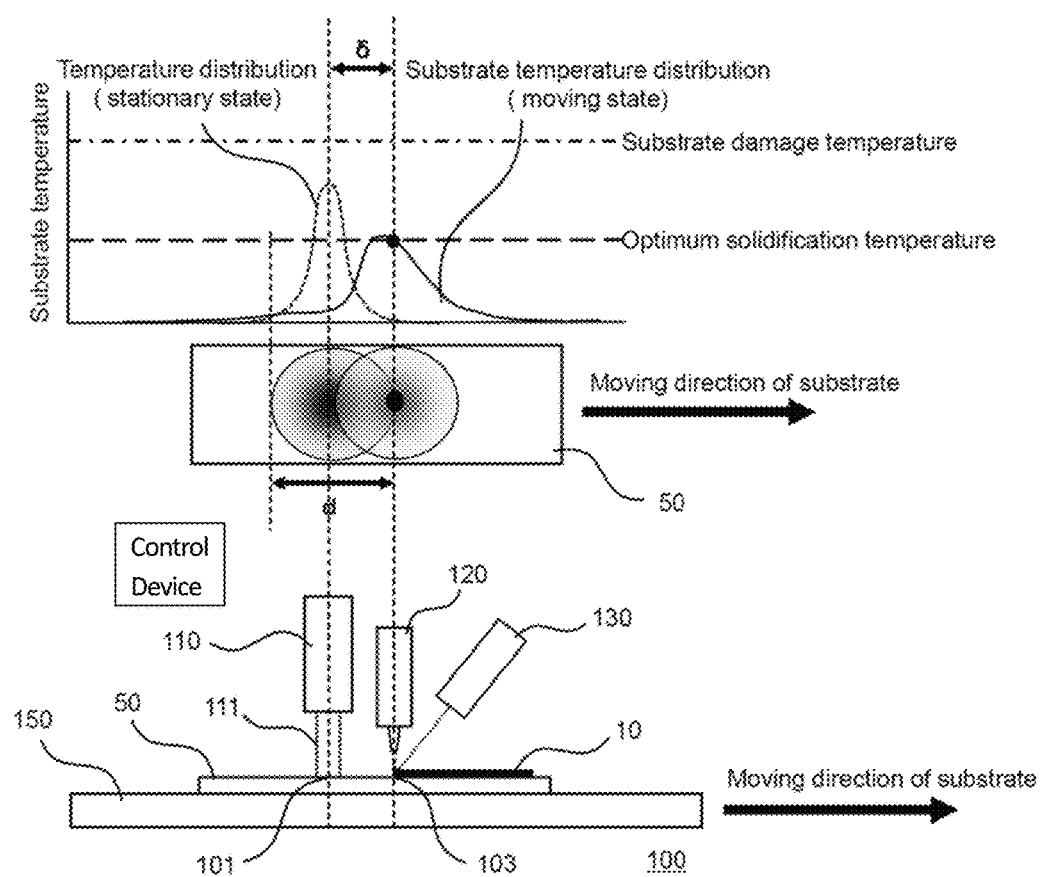
FIG. 5 is a schematic diagram of a manufacturing apparatus 100 of a structure related to one embodiment of the present invention, a schematic diagram showing a temperature distribution when substrate 50 is viewed from the upper surface and a schematic view showing a temperature distribution of substrate 50 when moved.

A structure manufacturing apparatus related to the present embodiment described above is explained. FIG. 5 is a schematic view of the structure manufacturing apparatus 100 related to the present embodiment and shows a temperature distribution of the substrate 50 when seen from above and a schematic view showing the temperature distribution when the substrate 50 is moved.

The structure manufacturing apparatus 100 related to the present embodiment is an apparatus for forming a continuous structure on a substrate 50 by turning a solution into droplets and impacting the droplets on the substrate 50. The structure manufacturing apparatus 100 comprises, for example, a heating part 110, a discharge part 120, a temperature measuring part 130, a moving part 150 and a control part (not shown in the diagram).

The heating part 110 is arranged to face the substrate 50 and light 111 is irradiated to the irradiation position 101 of the structure forming surface (upper surface) of the substrate 50 and heated to a predetermined temperature. A light which provides energy to the surface of the structure 50 and can heat such as infrared, ultraviolet, a laser or an excimer laser beam can be used as the light 111 irradiated by the heating part, a known light can be used. When the surface temperature of the heated substrate 50 is too high, a boiling phenomenon due to partial uneven heating of the impacted droplets occurs, a dense and smooth fine surface structure is not obtained, and when the substrate heating temperature is too low, a drying effect is insufficient and the droplet spread. Although this depends on the droplet size when impacting, the droplet size is the range of 10 μm or more and 150 μm or less and preferably in the range of 50 μm or more and 100 μm or less and a substrate surface temperature of a droplet impacting a position 103 is preferred to be 50° C. or more and 200° C. or less as a temperature at which evaporation of the solvent is accelerated and the boiling phenomenon due to rapidly overheating does not occur. The heating part 110 heats the substrate at the irradiation position 101 to a temperature higher than a predetermined surface temperature so as to be the predetermined surface temperature at the droplet impacting position 103. At this time, the heating temperature is at a temperature lower than a damage temperature of the substrate. Known irradiation apparatuses can be used as the heating part 110 related to the present embodiment if the irradiation area and temperature described above can be realized.

The discharge part 120 is arranged to face the substrate 50, a solution is turned into droplets and droplets are discharged to a droplet impacting position 103. It is possible to use an inkjet head as the discharge part 120. Droplets discharged from the discharge part 120 have a droplet diameter of 10 μm or more and 150 μm or less, preferably in a range of 50 μm or more and 100 μm or less. By discharging droplets having such a droplet size, it is possible to form a linear fine structure with a thickness of 0.5 μm or more without overlapping strokes. The discharge part 120 is arranged separated by a predetermined distance from the heating part 110 in the moving direction of the substrate 50 (first direction).

Here, if a substrate can be heated by the light emitted from the heating part 110 and the substrate is used in the electronic and electrical equipment field, any known substrate can be utilized as the substrate 50 in the present embodiment. As such a substrate, for example, a silicon substrate, a sapphire substrate, a glass substrate, and a resin substrate or the like can be used. However, the substrate 50 is a substrate which can be heated to a temperature higher than the optimum temperature at which the solution (ink) for forming a structure solidifies. As the resin substrate, for example, polyimide or polyethylene terephthalate (PET), etc can be used. When using a resin substrate as the substrate 50, a short-wavelength light such as an ultraviolet ray or an excimer laser beam can be suitably used, and a blue LED can also be suitably used. In general, although a basal plate is used as the substrate 50, the present invention is not limited to a basal plate, if the substrate can be heated using light irradiated from the heating part 110 and is a substrate that can be impacted with droplets in order to formed a structure from the discharge part 120, then substrates with various shapes may be used.

The solution which can be used in the present embodiment to be discharged from the discharge part 120 is a solution which viscosity is increased by heating and where the solute is solidified, or a solution which viscosity is increased by heating and where the solute is crosslinked. The solution which can be used in the present embodiment, for example, is an ink containing a metal dispersed in an organic solvent with a fine particle size of 1 μm or less. The metal contained as a solute in the solution, for example is a metal which can form a wiring such as a metal comprising of any one of gold, silver, copper, platinum, palladium, tungsten, nickel, tantalum, bismuth, lead, indium, tin, zinc, titanium and aluminum, or an alloy comprising of an oxide thereof, or an alloy comprising of any two or more of each metal. In addition, as the solvent, if a volatile solvent (typically an organic solvent) of which these metals can be dispersible, it is possible to use known solvents. In the present embodiment, the solution discharged from the discharge part 120 may be a solution containing an insulating substance as a solute containing no metal.

The temperature measuring part 130 measures the surface temperature of the droplet impacting position 103 of the substrate 50. If the temperature measuring part 130 is close to the droplet impacting position 103 on the substrate 50 of the droplets, the droplets may be measured from any direction. The measurement position of the surface temperature of the heated substrate 50 is preferably set as close as possible to the impacting position of the droplets above the substrate 50. Since it is possible to use a non-contact temperature measurement device as the temperature measuring part 130, a detailed description thereof will be omitted.

The moving part 150 moves the substrate 50 or the heating part 110 and the discharge part 120 in a first direction. In FIG. 5, the moving part 150 is shown as a stage for placing the substrate 50. The moving part 150 may be a device for moving the heating part 110 and the discharge part 120. In addition, the moving speed of the moving part 150 is preferably controllable in a range of 1 mm/sec or more and 100 mm/sec or less.

The control part controls the moving speed of the moving part 150, the discharge cycle of the droplet and the heating the irradiation region 101 based on the surface temperature of the droplet impacting position 103. The control part, for example, is a computer used for device control. The control part controls the heating part 110 and the moving part 150 so that the surface temperature of the heated liquid droplets impacting position 103 forms a predetermined temperature distribution becoming lower towards the moving direction of the substrate 50.

(Manufacturing Method of a Structure)

A method for manufacturing a structure using the above-described structure manufacturing apparatus 100 is explained. In this embodiment, light is irradiated to the substrate (basal plate) 50 to be moved, a temperature profile with a peak temperature on the upstream side in the moving direction of the substrate 50 is formed, and droplets are impacted on a temperature region which becomes a low temperature on the downstream side in the moving direction of the substrate 50 from the peak temperature of the temperature profile. The control part moves the moving part 150 to match a discharge cycle of the droplets at a speed capable of forming a continuous fine structure. Light power irradiated from the heating part 110 is adjusted so that the surface temperature of the droplet impacting position 103 measured by the temperature measuring part 130 is an appropriate temperature for drying the droplet impacting on the substrate 50. As shown in FIG. 5, the substrate 50 is moved from the side of the heating part 110 in the direction of the discharge part 120 (first direction), droplets are discharged from the discharge part 120 to form a fine structure 10.

As shown in FIG. 5, the surface temperature profile of the substrate 50 at the irradiation position 101 immediately below the heating part 110 in a stationary state shows a Gaussian distribution for the irradiated region. However, at the droplet impacting position 103 which moves to immediately below the discharge part 120 by the moving part 150, the surface temperature of the substrate 50 shows an asymmetrical temperature distribution with respect to the irradiated region. While this provides the irradiating position 101 of the droplet impacting position 103 with energy by the light irradiated from the heating part 110, and shows a locally steep temperature rise, it is presumed that the temperature slowly decreases over time in the first direction side of the droplet impacting positions 103.

Figure 6:
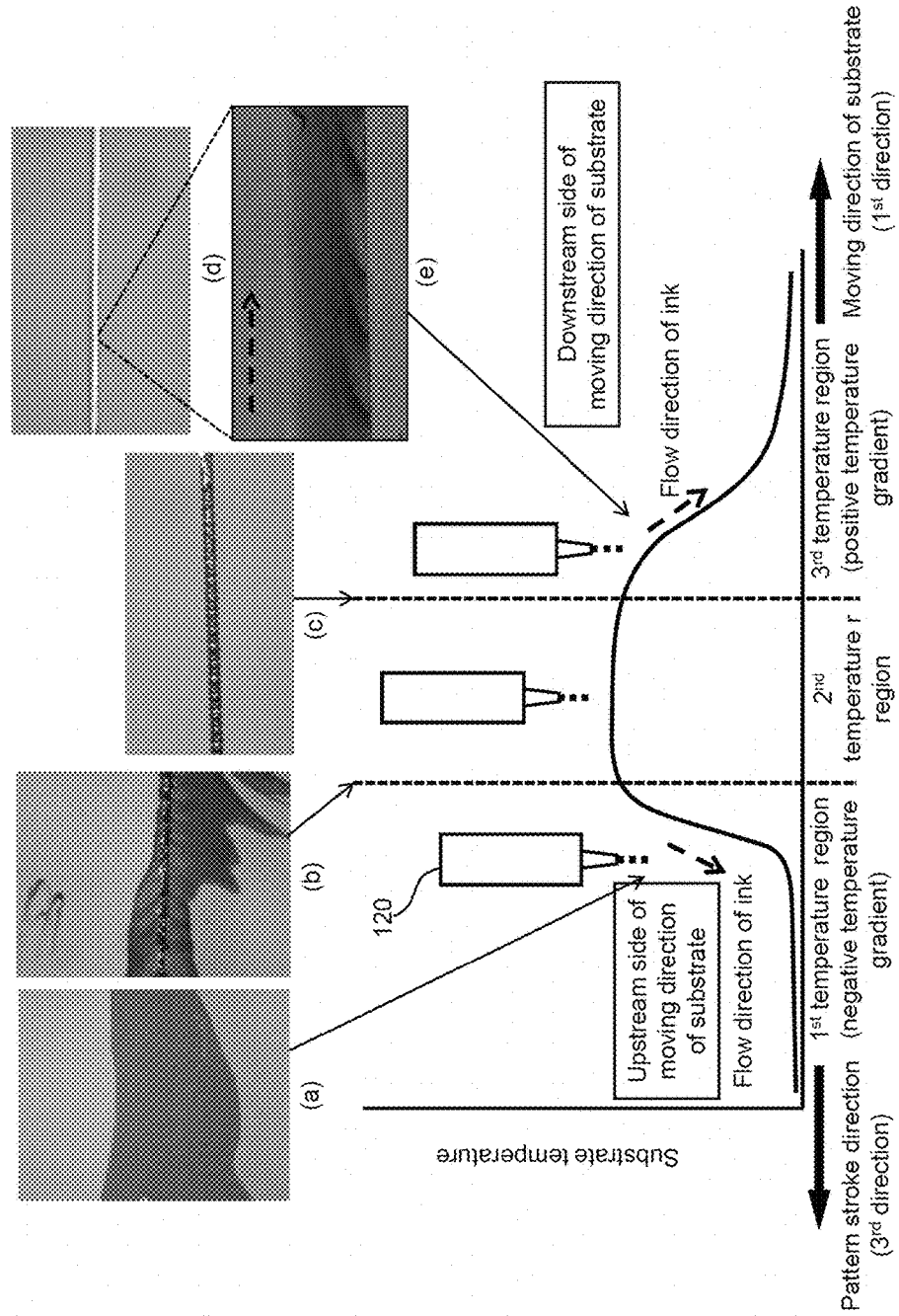
FIG. 6 is a diagram showing a relationship between the temperature distribution of a droplet impacting position 103 and a formed structure related to one embodiment of the present invention.
Figure 7:
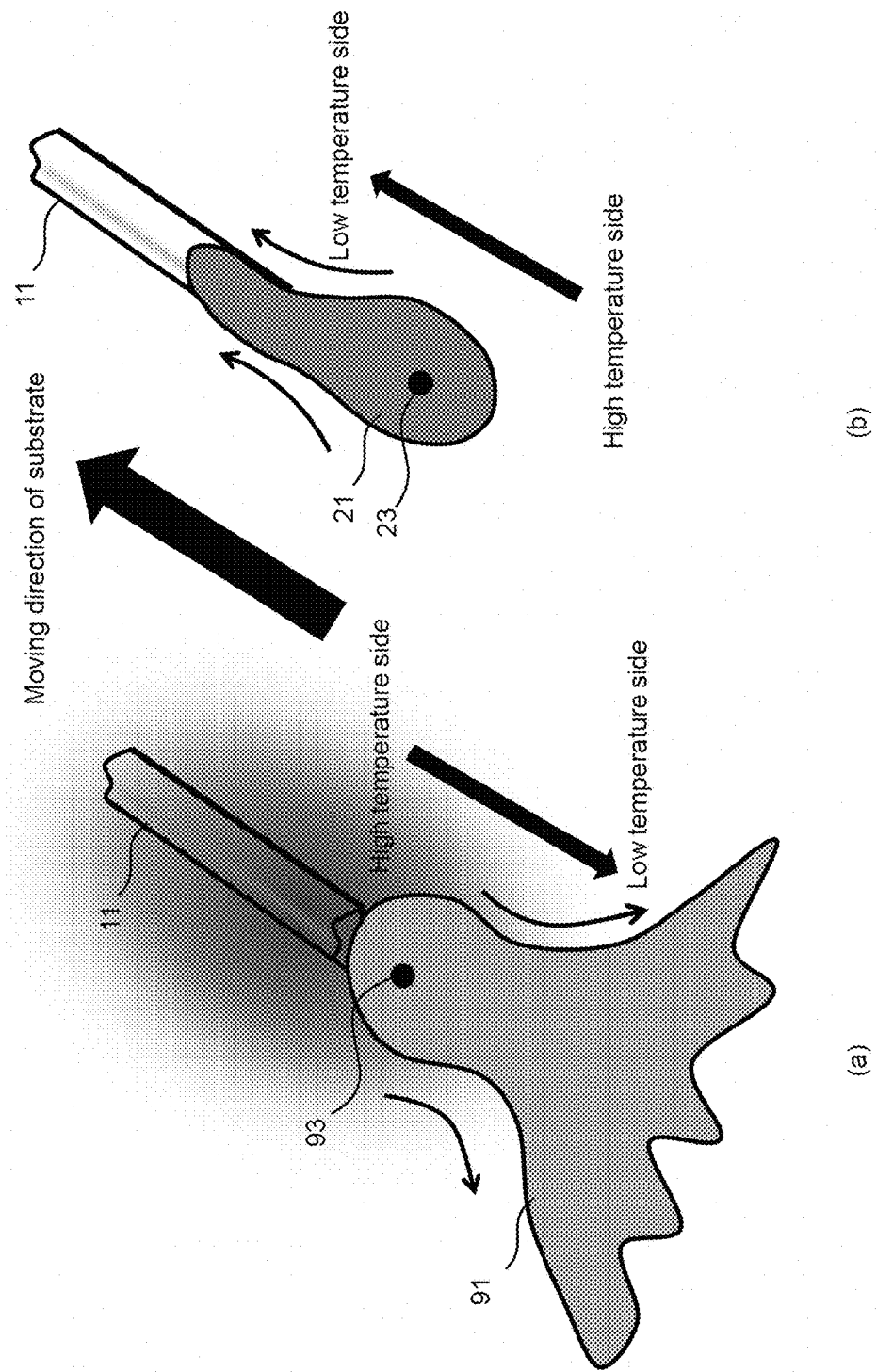
FIG. 7 is a schematic view showing an appearance of a structure 10 to be formed related to one embodiment of the present invention, (a) shows the appearance of a structure 90 at a first temperature region (negative temperature gradient) in FIG. 6 and (b) is a schematic view showing the appearance of the structure 10 to be formed at a third temperature region (positive temperature gradient) in FIG. 6.

Here, the local temperature distribution of the surface temperature of the substrate 50 in the droplet impacting position 103 related to the present embodiment is examined in more detail. FIG. 6 is a diagram showing the relationship between the temperature distribution of the droplet impacting position 103 and the formed structure related to the present embodiment. The lower graph shows the local temperature distribution of the surface temperature of the substrate 50 in the droplet impacting position 103 related to the present embodiment, (a) to (e) of FIG. 6 show structures formed at a different temperature region. FIG. 7 is a schematic view showing a formed structure 10 related to one embodiment of the present invention, (a) of FIG. 7 is a schematic view showing the state of the structure 90 in the first temperature region (negative temperature gradient) in FIG. 6, and (b) of FIG. 7 is a schematic view showing the state of formed structure 10 in a third temperature region (positive temperature gradient) in FIG. 6.

As described above, although the temperature distribution of the droplet impacting position 103 related to the present embodiment is a non-Gaussian distribution since the substrate is moving, the positional relationship between the droplet impacting position 103 and the third temperature region (positive temperature gradient) shown in FIG. 6 is intended for one-dimensional drawing, for example, only a linear pattern can be formed. In contrast, in order to make two-dimensional drawing possible, a temperature distribution having a hat shape or double hump shape may be formed by rotating the one-dimensional temperature distribution around a droplet impacting position 103 above the moving substrate. The temperature profile related to the present embodiment is defined by the input power of light, thermal conductivity, heat capacity and moving speed of the substrate 50. More specifically, a temperature distribution is shown including a first temperature region increasing towards the moving direction of the substrate 50, a second temperature region where the temperature is constant or decreases slightly towards the first direction, and a third temperature region in which the temperature decreases toward the moving direction of the substrate 50 at a smaller rate than the rate at which the temperature in the first temperature region increases.

The first temperature region (negative temperature gradient) is a region in which the droplet impacting position 103 is heated by the heating part 110 and the temperature toward the first direction increases rapidly, and as is shown in (a) of FIG. 6, although the solution including droplets is volatile and the solute included in the solution solidifies, in the case of a temperature where the solution is not volatilized immediately, the solute is not sufficiently solidified. As is shown in (a) of FIG. 7, in the first temperature region, the temperature on the substrate 50 at the side of the solute 15 impacted first and being solidified is high, and the temperature on the substrate 50 at the side of the impacting center position 93 of a droplet is a low temperature gradient. With such a temperature gradient, solution 91 spreads two-dimensionally from the surface of the substrate 50 with a high temperature to the surface with a low temperature on the substrate 50 (downstream side in the direction of the pattern strokes) where the solute has not impacted. In addition, in the first temperature region and second temperature region boundary, as is shown in (b) of FIG. 6, although the solute contained in the solution is solidified, the solution which is not completely solidified similarly spreads to the surface of the substrate 50 with a low temperature.

In the second temperature region, since the droplet impacting position 103 has an equal to or higher than optimum temperature at which the solute solidifies, although the solute is solidifies, the rate of volatilization and solidification of the solvent is rapid. Therefore, as is shown in (c) of FIG. 6, formed structures become a dumpling-like structure such as continuous droplets and become insufficient structure for use as a wire or an optical waveguide or the like.

Figure 8A:
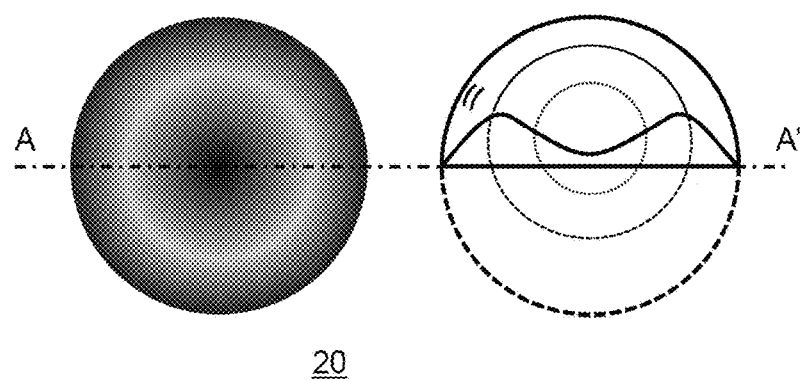
FIG. 8A is a schematic view showing the shape of a structure 10 related to one embodiment of the present invention.
Figure 8B:
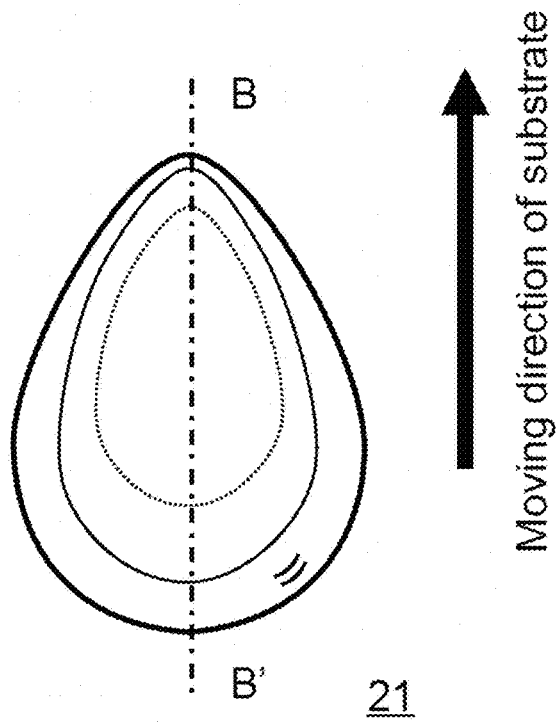
FIG. 8B is a schematic diagram showing droplets 21 solidified above a moving substrate.
Figure 8C:
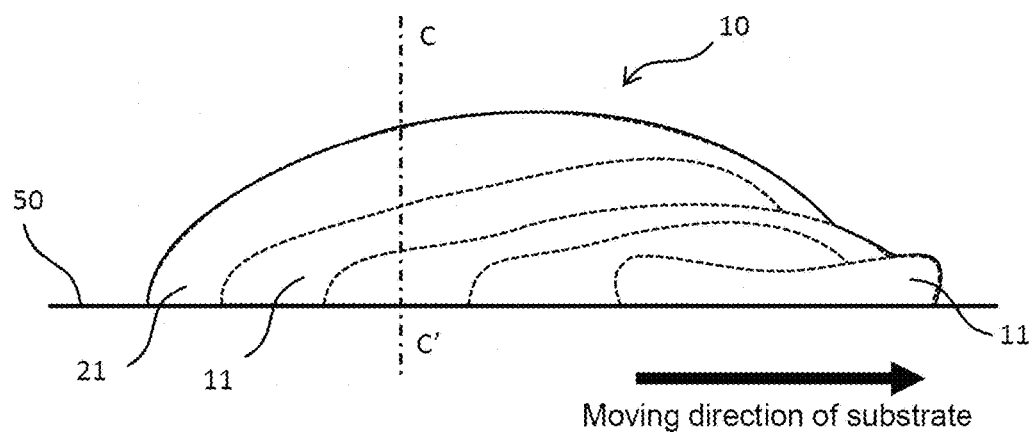
FIG. 8C is a cross-sectional view taken along BB' of structure 10 in FIG. 8B.
Figure 8D:
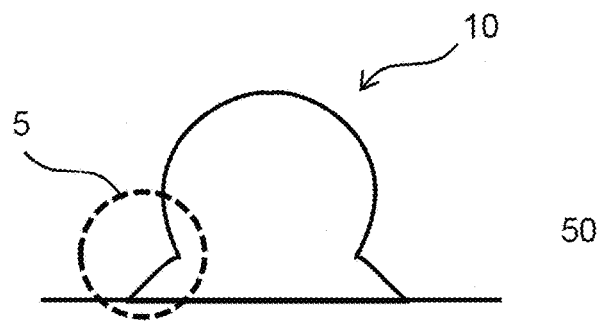
FIG. 8D is a cross-sectional view of the structure 10 in CC' in FIG. 8C.

On the other hand, in the third temperature region, although the solvent of the droplets impacted on the droplet impacting position 103 is vaporized and the solute gradually solidifies, as is shown in (b) of FIG. 7, contrary to the case of the first temperature region (negative temperature gradient), the temperature gradient above substrate 50 becomes a low temperature (positive temperature gradient) from a high temperature towards the solute 15 which first impacts from the droplet impacting position 103 and is substantially solidified. In the case where the impact center position 23 of the droplet 21 is in the third temperature region, the non-solidified solute 21 of the droplet impacting position 103 covers the solute 15 which impacts first and is substantially solidified without spread two-dimensionally on the substrate due to a capillary force, and by solidifying gradually, the droplets are solidified while forming a homogeneous surface continuously connected with the solute 15 solidified first. As a result, as is shown in (d) and (e) of FIG. 6, although the formed structure 10 becomes a shape close to a droplet since the droplet solidifies quickly in the part in contact with the substrate 50, a smooth consecutive and homogeneous structure is obtained in the upper part due to gradual solidification In the present invention, it is important that light is irradiated on the substrate 50 to be moved, forming a temperature profile with a peak temperature on the upstream side in the moving direction of the substrate 50, and a droplet is impacted from the peak temperature of the temperature profile to a temperature region which becomes a low temperature of the downstream side of the moving direction of the substrate 50. FIG. 8 FIG. 8A to FIG. 8D are schematic views showing the shape of the structure 10 related to an embodiment of the present invention, FIG. 8A is a schematic diagram showing a droplet 20 which has solidified on a stationary substrate, FIG. 8B is a schematic diagram showing a droplet 21 solidified on the substrate to be moved, FIG. 8C is a cross-sectional view of structure 10 taken along BB' in FIG. 8B, and FIG. 8D is a cross-sectional view of the structure 10 in CC' in FIG. 8C.

When substrate 50 which is heated by irradiation with light is impacted with droplets in a stationary state, the droplets become solidified and as is shown in FIG. 8A, a recessed center part shape (coffee ring) is formed. On the other hand, when substrate 50 which is heated by irradiation with light is impacted with droplets in a moving state, the droplets become solidified in the form of a droplet type shape as is shown in FIG. 8B. However, the droplets also solidify in a shape where the center part is recessed even when moving the substrate 50.

As is shown in FIG. 8C, when continuously impacting droplets while moving the substrate 50 which is heated by irradiating light, the impacted droplets 21 overhang the solute 15 that impacts first and is in the process of solidifying and gradually solidify. At this time, since the solute 15 that impacts first and is in the process of becoming solidified has a recessed center shape, although the part of the droplet 21 which impacts later in contact with the substrate 50 solidify immediately, non-solidified solution overlaps a recess of the first impacted solute 15 which is solidified. This is inferred to be due to a capillary phenomenon caused by the recess of the solute 15 impacting first and in the process of solidifying.

Therefore, droplets incline in the moving direction of the substrate 50 and a droplet overlapping solidified layer 1 which is continuously overlapped and solidified is formed. In addition, droplet flows on the droplet overlapping solidified layer 1 and a droplet flow solidified layer 3 which is continuously solidified without the droplets overlapping is formed. In the present embodiment, the droplet 21 impacted later is preferably solidified to overhang the surface of a plurality of droplets part of the solute 15 impacted first and in the process of being solidified. By solidifying in this way, the structure 10 is formed having a surface with the droplet flow solidified layer 3 having a smooth consecutive surface. At this time, from the difference in speed of solidification, a recess part 5 is formed at the boundary region of the droplet overlapping solidified layer 1 and the droplet flow solidified layer 3. In addition, due to a capillary phenomenon, since the droplet is sucked up onto the droplet overlapping solidified layer 1, as is shown in FIG. 8D, the droplet flow solidified layer 3 is formed with a mushroom shaped reverse tapered cross-sectional shape.

Therefore, in the third temperature region where the solute first impacted and being solidified exists, since the solute impacted first and being solidified is a guide for sucking up droplets impacted later, a high aspect ratio structure 10 is formed without impacted droplets spreading on the substrate 50. Therefore, in the present invention, the structural 10 with a high aspect ratio is formed in the axial direction (drawing line direction).

To realize the structure 10 (drawing pattern) with a smooth surface and high aspect ratio, it is necessary that the droplet 21 impacted later have a greater width than the solute 15 impacted first and solidified in a dot pattern on the substrate 50 must flow so as to overhang on the substrate 50, and in order to cause a flow of the impacted solute (droplets) 21 on such a substrate 50, a certain degree of temperature gradient is required. On the other hand, when the temperature gradient is too large, although the solute (droplets) 21 that have impacted on the substrate 50 is filled into a cut of the solute solidified in a dot shape, and it is possible to obtain a continuous and homogeneous structure surface, because the structure 10 overhangs thin and long, the overlap in the thickness direction of the structure 10 is not thick and the structure 10 (drawing pattern) with a high aspect ratio cannot be obtained. It can be seen from the above that, from intensive experiment in order to form a structure 10 with a high aspect ratio and form a plurality of solute droplets having a smooth uniform surface without unevenness, it is dependent on the characteristics of the solute and solvent, and the relationship between the moving speed of the substrate 50 and the solute ejection frequency.

In order to form such the structure 10 with such a high aspect ratio, in this embodiment, the temperature gradient in the temperature region which becomes a low temperature of the downstream side in the moving direction of the substrate 50 is 1° C./mm or more and 100° C./mm or less. If the temperature gradient is too large, the force that pushes impacted droplets becomes too large and the aspect ratio decreases. On the other hand, when the temperature gradient is small, the force pushing the impacted droplets becomes small and the aspect ratio increases. However, when the temperature gradient is too small, since the solute hardly solidifies, as a result, the impacted droplets spread on the substrate 50 which is not preferable.

Figure 9A:
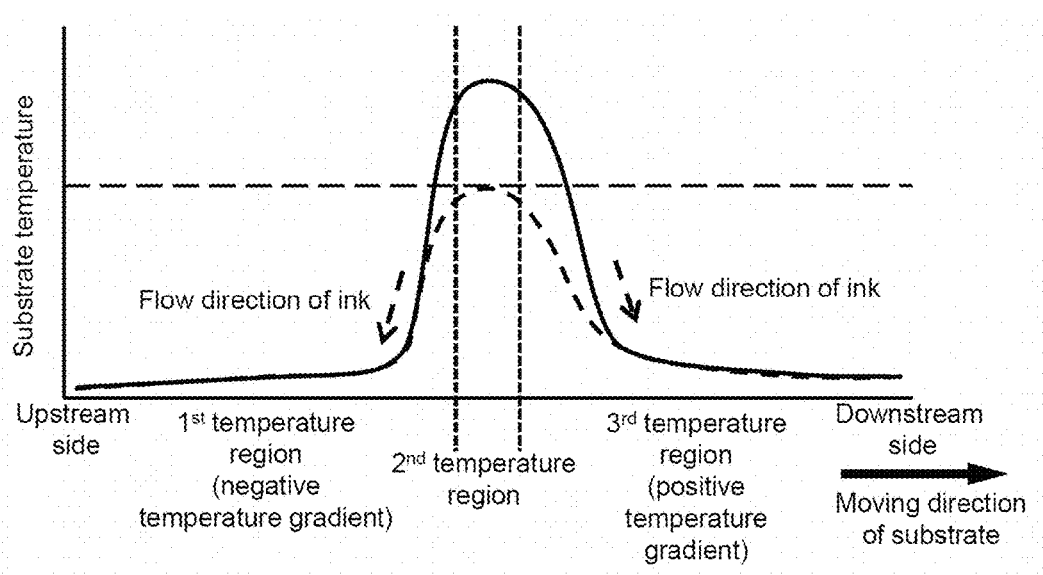
FIG. 9A is a diagram showing a temperature distribution of a droplet impact position 103 related to one embodiment of the present invention.
Figure 9B:
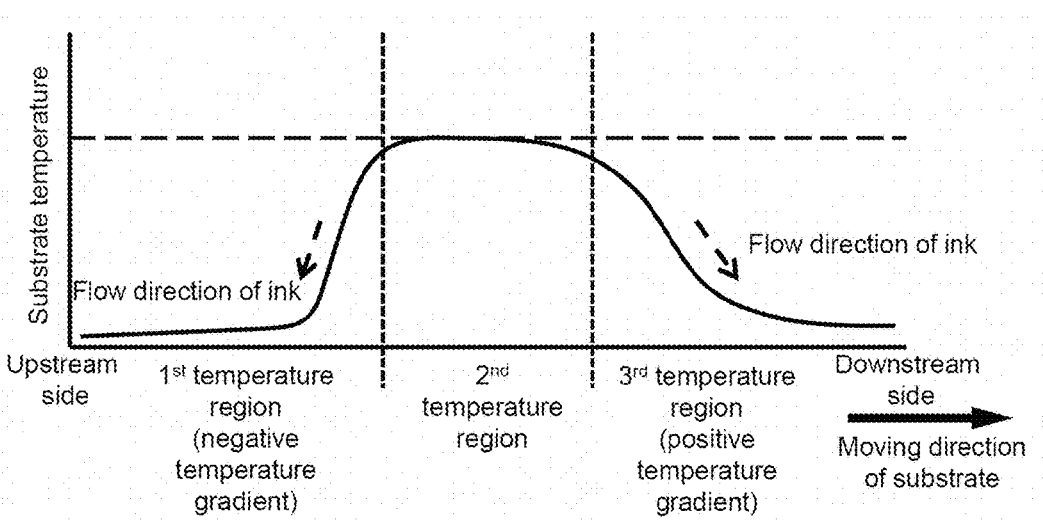
FIG. 9B is a diagram showing a temperature distribution of a droplet impact position 103 related to one embodiment of the present invention.

Referring to FIG. 9A and FIG. 9B, the reasons why a hat shape and a double hump shape as the temperature distribution of the droplet impacting position 103 related to the present embodiment is preferred is explained. As described above, since the substrate is moving, although the temperature distribution of the droplet impacting position 103 related to the present embodiment is a non-Gaussian distribution, the positional relationship between the droplet impacting position 103 and the third the temperature region (positive temperature gradient) shown in FIG. 6 is intended for one-dimensional drawing, for example, only a linear pattern can be formed. In contrast, in order to make two-dimensional drawing possible, a temperature distribution with a hat shape or double hump shape may be formed above the moving substrate by rotating this one-dimensional temperature distribution around the center of the droplet impacting positions 103. In addition, FIG. 9A shows an example of a temperature distribution close to a Gaussian distribution and FIG. 9B shows an example of a hat shaped temperature distribution related to the present embodiment. Since the rise and fall in temperature is relatively steep in a temperature distribution close to a Gaussian distribution, the region in an appropriate temperature region for forming a structure is extremely narrow. Therefore, when the temperature of the droplet impacting position 103 is too high, the droplets bump and the solute has a divided shape, and when the droplet impacting position 103 is too low, viscosity of the droplets is reduced and spread over the substrate 50 and control becomes difficult.

On the other hand, in the third temperature region of the present embodiment, in a first direction side of the droplet impacting position 103, the solution of the droplets that have impacted on the droplet impacting position 103 is vaporized, the solute solidifies, overhanging the solute which impacts first and is being solidified to form the droplet overlapping solidified layer 1. In addition, by continuously solidifying gradually without overlapping droplets, a droplet flow solidified layer 3 is formed so that the droplets solidified first become familiar with the solute. In this way, in this embodiment, it is possible to from a smooth continuous and homogeneous structure and it is possible to obtain a good structure 10.

Figure 10:
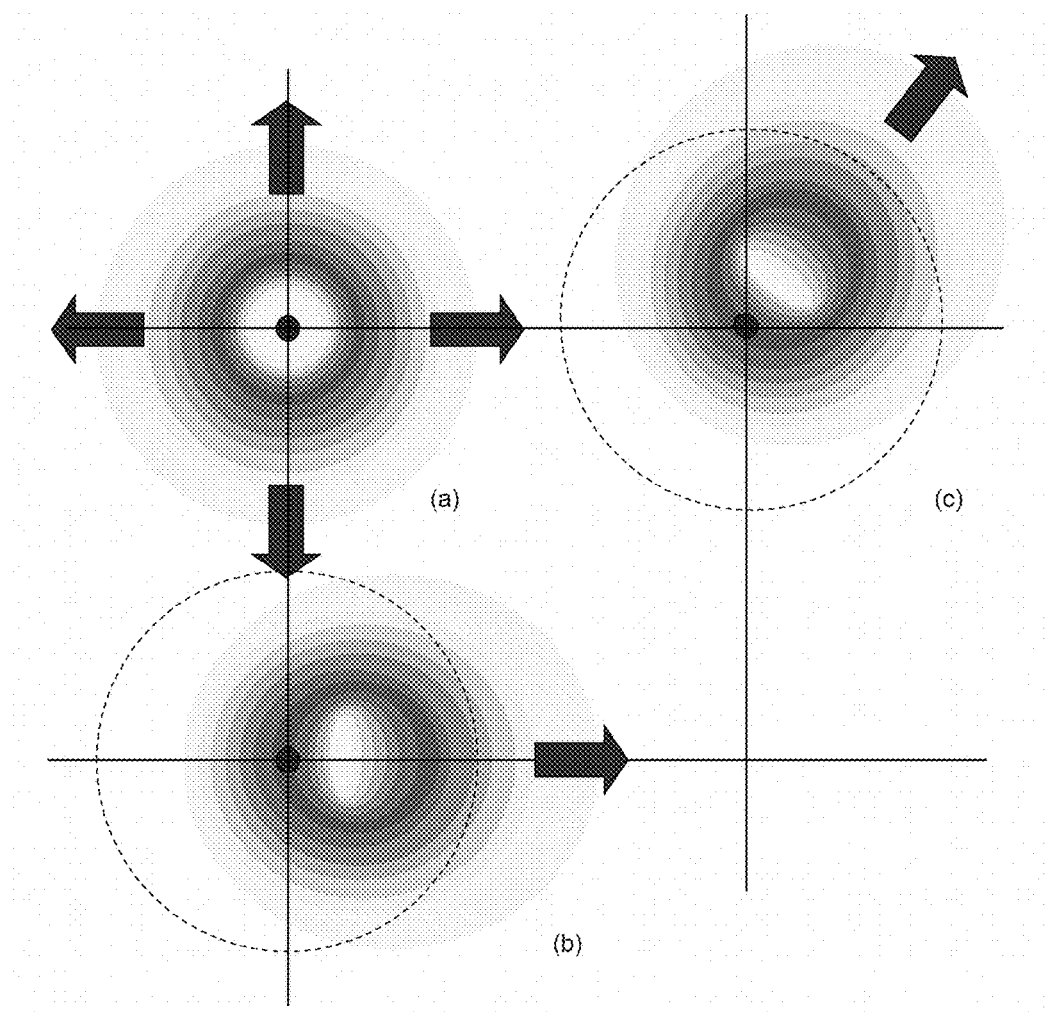
FIG. 10 is a schematic view of a ring-shaped illumination light related to one modified example of the present invention.

Here, another example of a hat shaped and double-hump shaped temperature distribution is explained. In order to form a hat shaped and double hump shaped temperature distribution, the heating part 110 may also be used in a shape having a ring-shaped illumination light. FIG. 10 is a schematic view of a ring-shaped illumination light related to a modification of the present invention. For example, by tilting the center axis of a light supplied from a light source at a predetermined angle with respect to the central axis of a waveguide of the heating part 110, the shape of the light irradiated to the substrate 50 becomes ring-shaped as in (a). By moving this type of ring-shaped illumination light not only in four directions as shown in (b) but in any direction of 360° on the substrate 50 as shown in (c), it is possible to form a temperature distribution with a hat shape or double hump shape.

Figure 11:
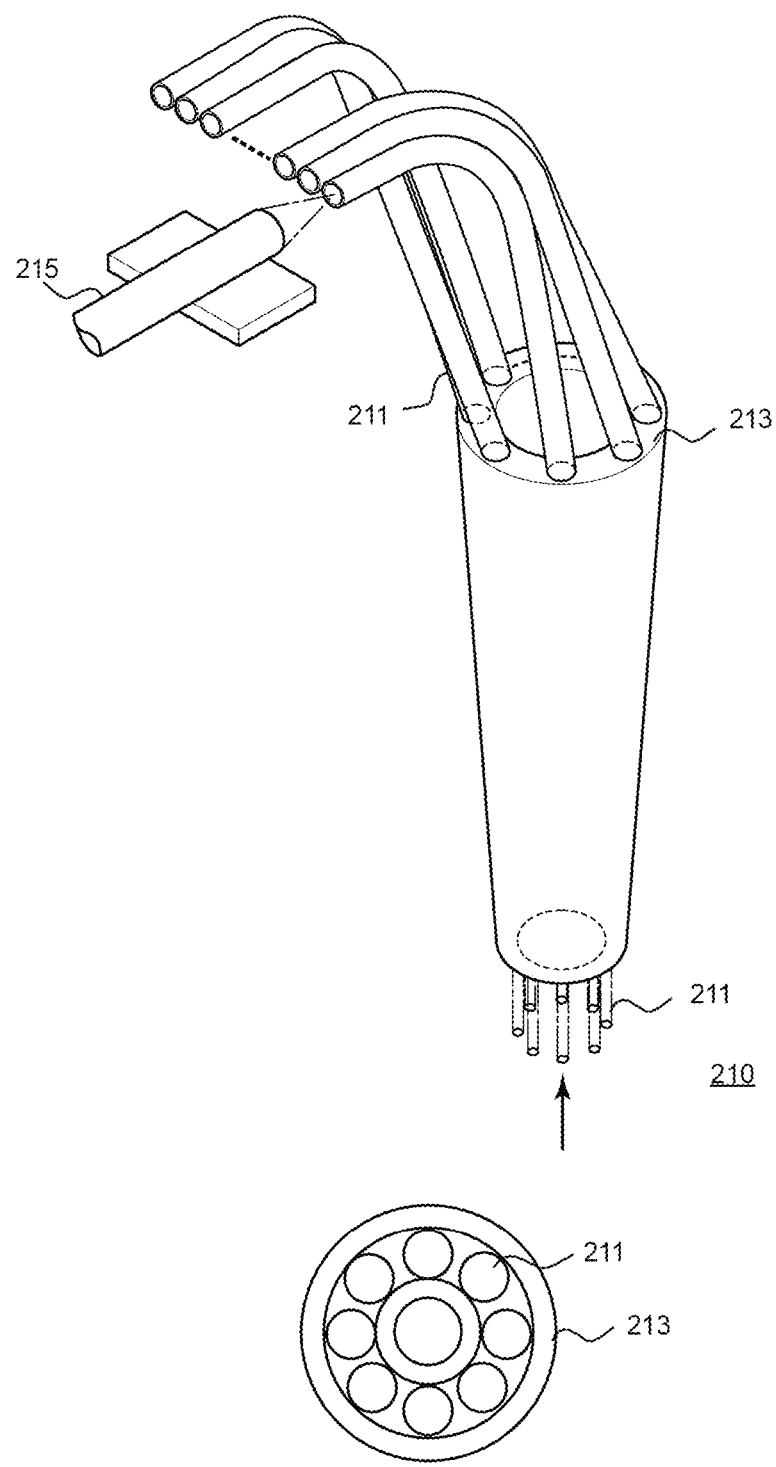
FIG. 11 is a schematic view of the heating part 210 according to a modified example of the present invention.
Figure 12:
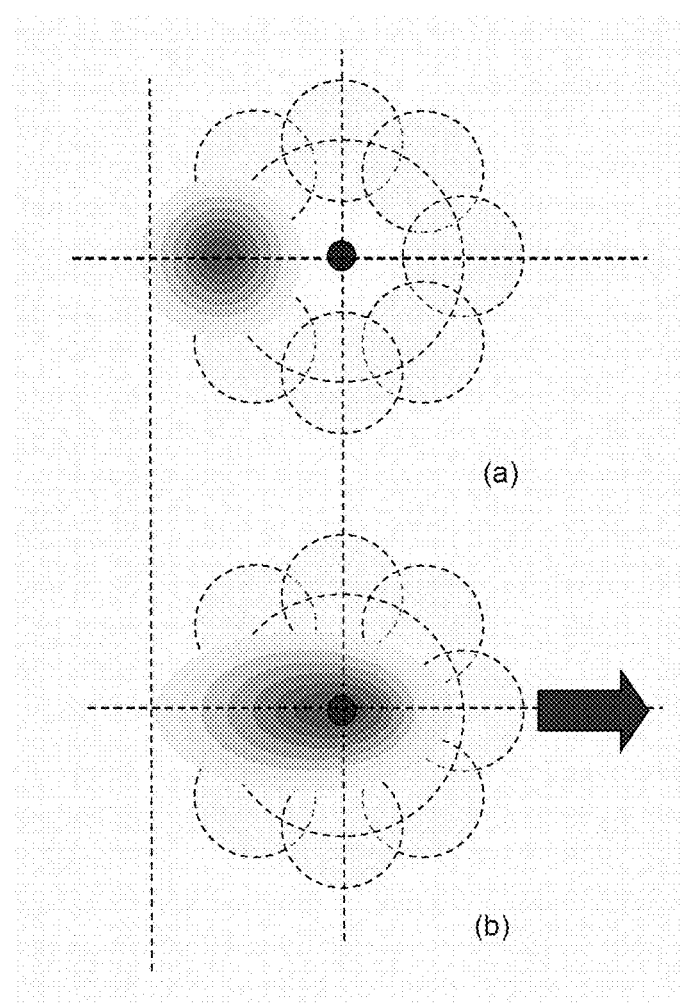
FIG. 12 is a schematic view of a ring-shaped illumination light according to a modification of the present invention.

In addition, FIG. 11 is a schematic view of the heating part 210 related to one modification. The heating part 210, for example, includes a structure in which a plurality of waveguides 211 for irradiating light are arranged in a circle using a jig 213. Light is supplied from a light source 215 to the waveguide 211. At this time, light from the light source 215 may be separated to each waveguide 211 respectively, and each light from the light source 215 may be sequentially supplied to the waveguide 211 respectively. By doing so, the heating part 210 irradiates ring-shaped light and the hat shaped and double hump shaped temperature distribution as described above can be formed. In addition, FIG. 12 is a schematic diagram of a ring-shaped illumination light related to a modification of the present invention. By switching the waveguide 211 to be irradiated as shown in (a) and moving the substrate 50, the heating part 210 can form the hat shaped and double hump shaped temperature distribution as is shown in (b).

As described above, according to the present invention, it is possible to suppress wetting and spreading of ink in the width direction of a drawing line on a substrate, and realize a structures with an unprecedented a high aspect ratio and realize a manufacturing method of this structure and a line pattern.

In addition, using the structure described above, it is possible to form a line pattern on the substrate. Such a line patterns can be arranged with a width of 0.5 µm or more and an aspect ratio of 0.1 or more. In addition, according to the present invention, for example, in the case where a line pattern in used in fine wiring formation, since high-frequency loss due to unevenness of the drawing wire surface is significantly suppressed, it is possible to form fine wiring with excellent high frequency characteristics that can be used in a region up to several tens of GHz. In addition, in the case where the fine wiring is applied to optical waveguide formation, light scattering in the side is significantly suppressed and it is possible to form a light waveguide with less loss.

EXAMPLES

A structure formed on a substrate related to the present invention described above, a manufacturing method of a structure and a structure manufacturing apparatus are explained in further detail with reference to examples (Examination of the Solidification State of Droplets)

Figure 13A:
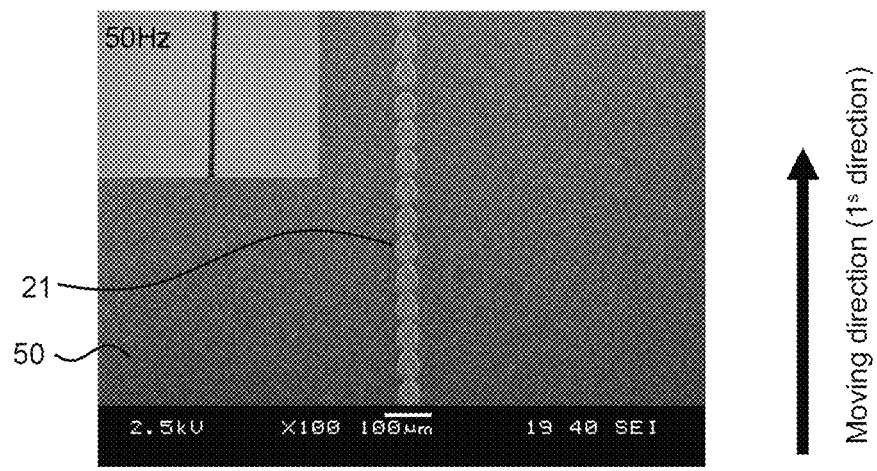
FIG. 13A is an SEM image obtained by observing a solidification state of a droplet related to one embodiment of the present invention.
Figure 13B:
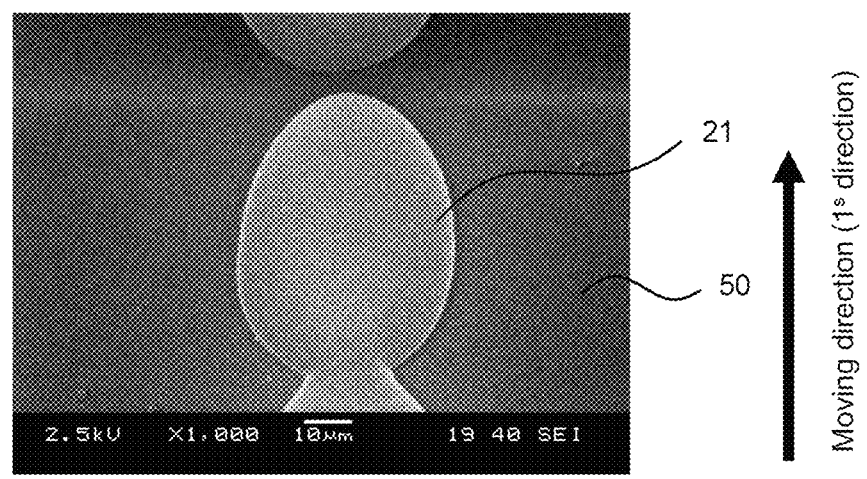
FIG. 13B is an enlarged view of the SEM image obtained by observing a solidification state of a droplet related to one embodiment of the present invention.
Figure 13C:
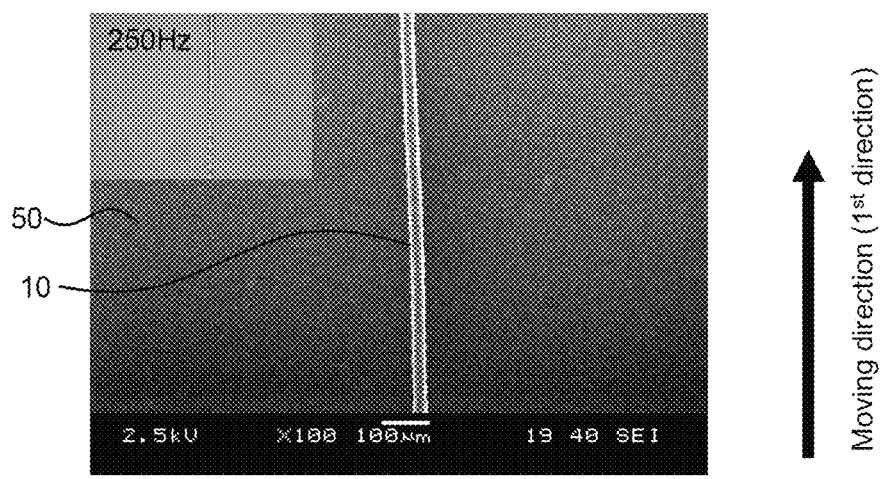
FIG. 13C is an SEM image of the droplets solidified on the substrate discharged in a cycle of 250 Hz.
Figure 13D:
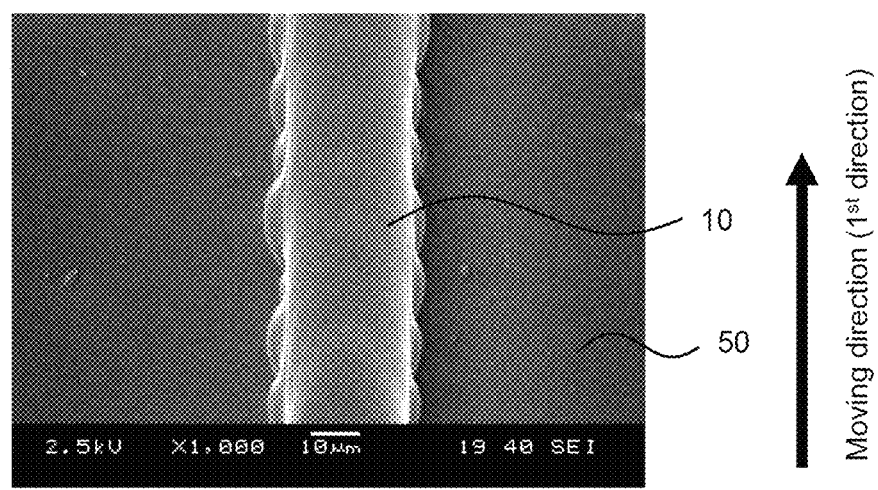
FIG. 13D is an enlarged view of the SEM image of FIG. 13C.

FIG. 13A to FIG. 13D are SEM images obtained by observing the solidification state of a droplet related to the present embodiment. FIG. 13A is an SEM image of the droplets solidified on the substrate discharge at a cycle of 50 Hz, and FIG. 13B is an enlarged view. In addition, FIG. 13C is an SEM image of the droplets solidified on a substrate discharged at a cycle of 250 Hz, and FIG. 13D is an enlarged view. As can be seen from FIG. 13A and FIG. 13B, the impacted droplets have a drop type shape spreading in an opposite drawing direction to the moving direction of the substrate 50. By injecting droplets with such a shape more quickly, the solute that impacted first and is being solidified becomes a central recessed part, and although droplets impacted later solidify quickly in parts in contact with the substrate 50, the solution that has not been solidified overlaps the recesses impacted first and solidified. In this way, the droplet is sucked onto the droplet overlapping solidified layer 1, and the structures related to this embodiment having the high aspect ratio shown in FIG. 13C and are formed.

Figure 14A:
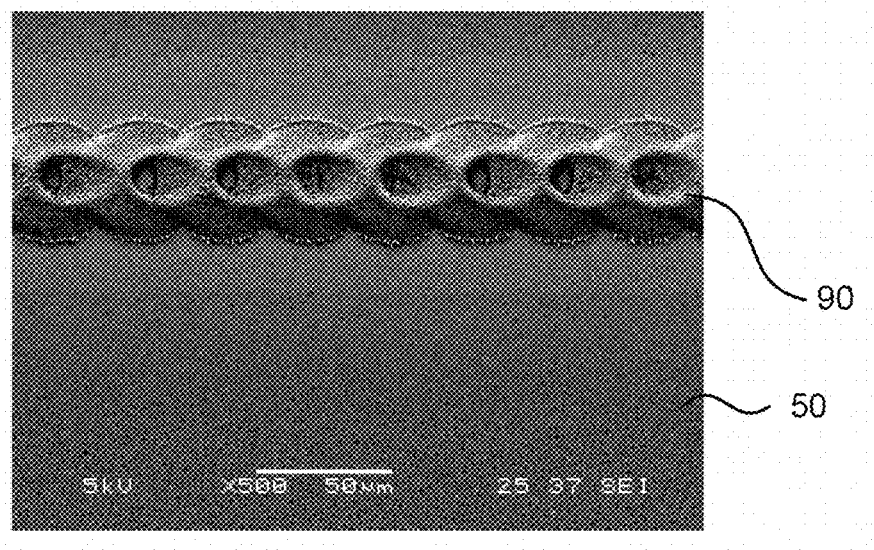
FIG. 14A is a diagram showing the relationship between a temperature gradient and an aspect ratio on a substrate 50 related to one embodiment of the present invention.
Figure 14B:
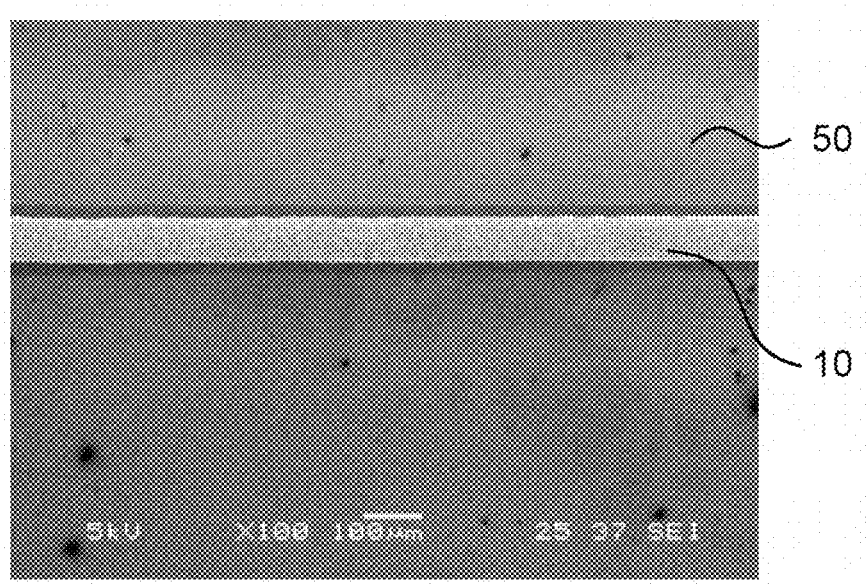
FIG. 14B is a SEM image of structure 10 related to one embodiment of the present invention formed with a temperature gradient of 1° C./mm or more and 100° C./mm or less.
Figure 14C:
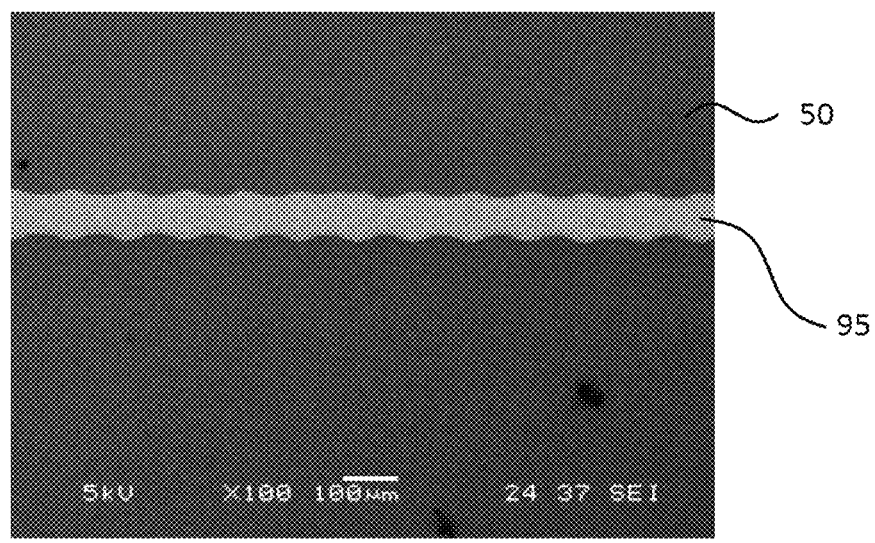
FIG. 14C is a SEM image of the structure 50 formed with a gradient temperature larger than 100° C./mm.

FIG. 14A to FIG. 14C are diagrams showing the relationship between a temperature gradient and aspect ratio on the substrate 50, FIG. 14A is a SEM image of a structure 90 formed with a temperature gradient less than 1° C./mm, FIG. 14B is a SEM image of structure 10 related to an embodiment of the present invention formed with a temperature gradient of 1° C./mm or more and 100° C./mm or less, and FIG. 14C is an SEM image of a structure 95 formed with a temperature gradient larger than from 100° C./mm. As is shown in the experimental results in FIG. 14A to FIG. 14C, in a practical range, solute droplets 21 are impacted in a region (third temperature area) having a positive temperature gradient of the temperature distribution in FIG. 6 on the substrate 50 while moving described above, and it can be seen that the temperature gradient at this time is preferably in the range of 1° C./mm or more and 100° C./or less.

In FIG. 14A, in the case where the temperature gradient on the moving substrate 50 is less than 1° C./mm, the solute impacted on a substrate 50 has already impacted flows so as to be directed above the solute which has begun to solidify and but move, however, because the movement amount on the substrate 50 of the impacting solute is insufficient, it is not possible to cover gaps in the solute solidified in a dot shape impacted earlier, and irregularities appear on the side of the linear shaped drawing structure. In addition, in FIG. 14C, in the case where the temperature gradient on the substrate 50 to be moved is greater than 100° C./mm, although the impacted solute is moving so as to sufficiently cover the gaps in the solute impacted first and solidified into a dot shape, because the movement amount is too large, a solute filling the gaps in the solute impacted first and solidified into a dot shape is not sufficiently supplied and irregularities appear on the side of the linear drawing structures. In addition, in the case of the line width in FIG. 14A and FIG. 14C, the thickness of the structure is not taken more than 1 μm, that is, a high aspect ratio cannot be obtained. On the other hand, FIG. 14B, shows the case where the temperature gradient on the substrate 50 to be moved is in the range of 1° C./mm or more and 100° C./mm or less, an appropriate amount of the solute fills the gaps of the solute impact first and solidified in a dot shape, and a structure with an aspect ratio of 0.2 or more, a side of the linear drawing structure and a straight smooth uniform structure without irregularities is formed.

(Substrate Heating Simulation by Laser Irradiation)

In order to verify the state of wetting and spreading of the droplets, a heating simulation by laser irradiation of a substrate was performed. The parameters in Table 1 were used.

TABLE 1

| Substrate | | Glass substrate |
| --- | --- | --- |
| | | (26 mm × 76 mm × 1.1 mmt) |
| Substrate holder | | Iron steel |
| Substrate moving velocity | | 3 [mm/s] |
| Used light source | | $CO_2$ laser (laser 10.6 μm) |
| Irradiation time | | 22 [sec] |
| Irradiation intensity of light source | | Gaussian distribution |
| Ambient atmosphere | | 20° C. |
| Initial substrate temperature | | 20° C. |
| Air | Coefficient of viscosity | $1.85508^{-5}$ [Pa/s] |
| | Specific heat | 1003.62 [J/kg/K] |
| | Molecular weight | 28.9664 [g/mol] |
| | Thermal conductivity | 0.260305 [W/m/K] |
| Glass | Thermal conductivity | 0.74 [W/m/K] |
| | Specific heat | 750 [J/kg/K] |
| | Density | 2,560 [kg/m$^3$] |
| Iron steel | Thermal conductivity | 45 [W/m/K] |
| | Specific heat | 461 [J/kg/K] |
| | Density | 7,730 [kg/m$^3$] |
| Laser power | | 2,560 [kg/m$^3$] |
| Optical absorption | | 77 [%] |
| Irradiation intensity | | Gaussian distribution |
| Beam diameter | | 1.5 [mm] (1/e$^2$) |
| Optical absorption function | | A = Io {exp (c*z1) − exp (c*z2) |
| | | Io: Incident intensity |
| | | zi: Distance from surface |
| | | c: Optical-absorption coefficient |

Figure 15:
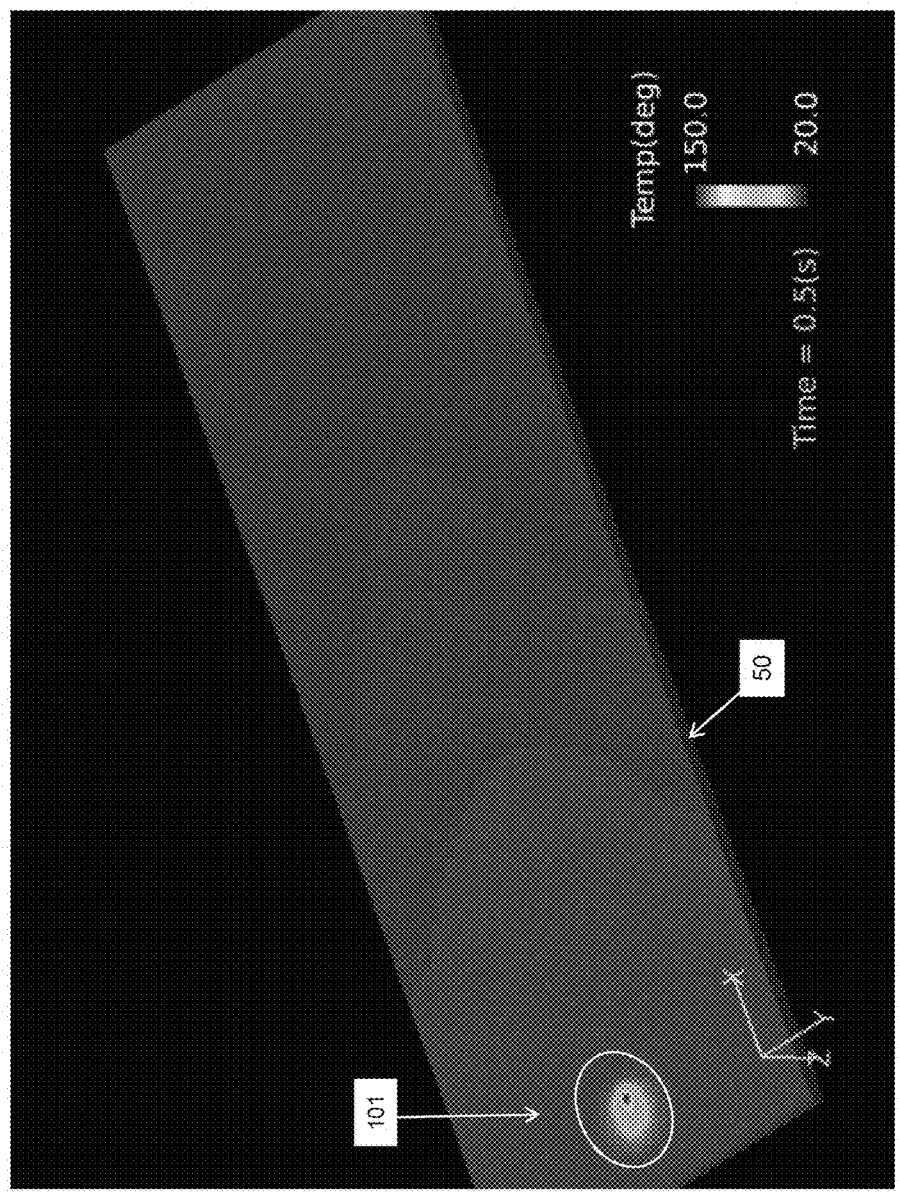
FIG. 15 is a diagram showing a simulation result related to one embodiment of the present invention.

The simulation results are shown in FIG. 15. As can be seen from FIG. 15, in the substrate irradiated with a laser moved in a first direction, a temperature distribution with a low temperature in the first direction is formed. From this result, the temperature distribution required for forming the structure related to the present invention was verified to be a temperature distribution which becomes a low temperature in the downstream side in the moving direction of the substrate 50.

Figure 16A:
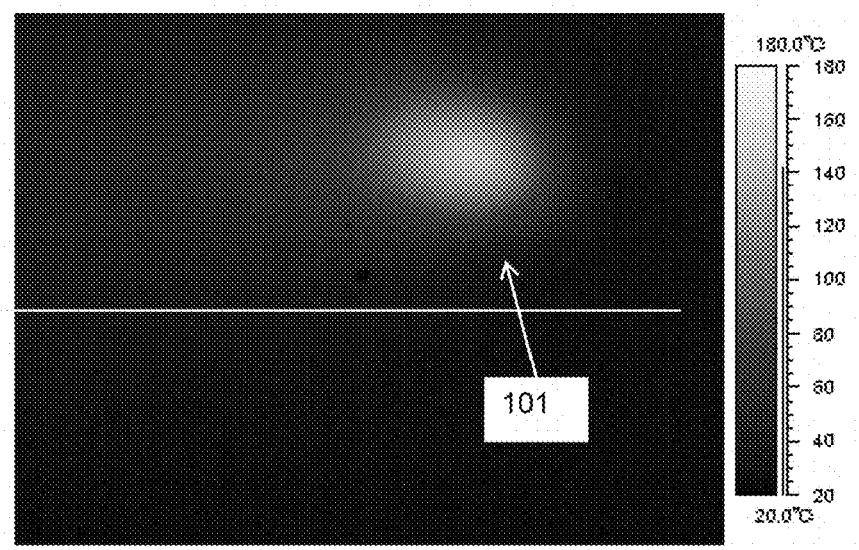
FIG. 16A is a diagram showing a measurement result using a thermo viewer related to one embodiment of the present invention.
Figure 16B:
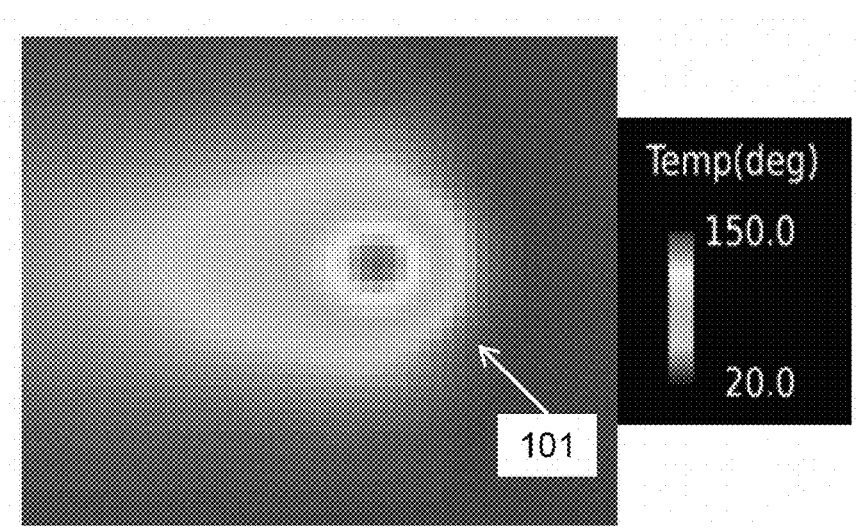
FIG. 16B is a diagram showing a measurement result using a thermo viewer related to one embodiment of the present invention.
Figure 16C:
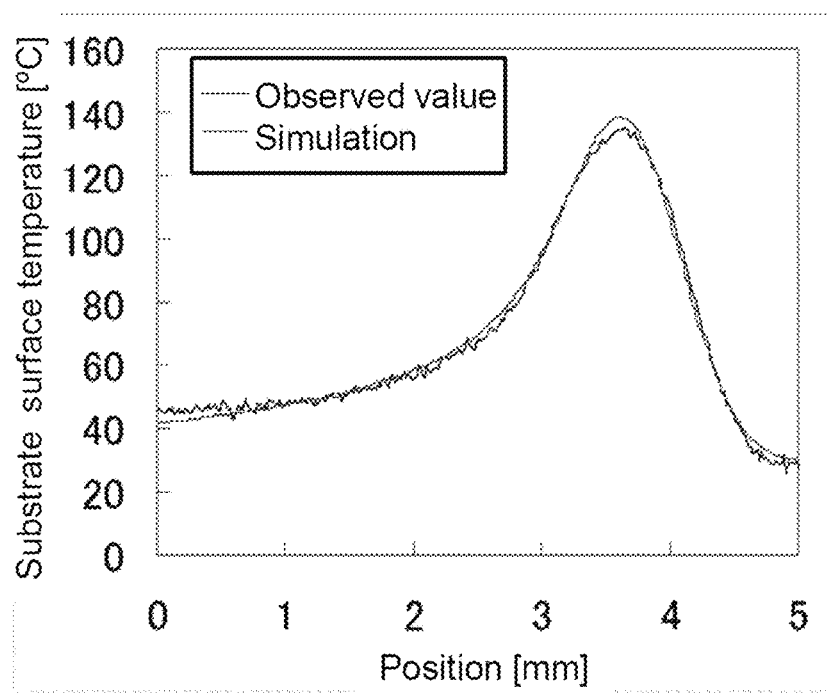
FIG. 16C shows the result of a comparison with the simulation.

The measurement results of using a thermos-viewer and comparison results with a simulation are shown in FIG. 16A to FIG. 16C. FIG. 16A shows measurement results using a thermos-viewer, FIG. 16B shows the simulation and FIG. 16C shows the results of a comparison using a graph of 2 results. The Measurement results show an asymmetrical temperature distribution with respect to the irradiated region in the simulation which matches well. From this result, it can be seen that light is irradiated on the substrate 50 to be moved, and a temperature profile is formed with a peak temperature on the upstream side in the moving direction of the substrate 50.

According to the present invention, it is possible to provide a structure which can control wetting and spreading of an ink in a width direction of drawn lines on a substrate and realize a high aspect ratio, a manufacturing method of the structure and a line pattern.

What is claimed is:

1. A structure manufacturing apparatus comprising:
a moving device moving a substrate;
a heating device irradiating light to a surface of the substrate to heat the surface of the substrate;
a discharge device impacting a droplet to the heated region of the substrate; and
a control device controlling the heating device and the moving device so that a temperature profile with a peak temperature on the upstream side in the moving direction of the substrate is formed, the temperature profile becomes lower towards the moving direction of the substrate, and the control device controlling a droplet impacting position of the droplet discharged from the discharge device,
wherein the control device impacts the droplet to a low temperature region on a downstream side in the moving direction of the substrate from the peak temperature of the temperature profile,
the temperature profile of the surface of the substrate forms a Gaussian distribution for an irradiated region of the light, and the temperature profile has an asymmetrical temperature distribution with respect to the irradiated region at the droplet impacting position immediately below the discharge device by moving the substrate to manufacture a structure including a droplet overlapping solidification layer obtained by droplets on the substrate, the droplets inclining in the direction of movement of the substrate and continuously overlapping each other and solidifying and a droplet flow solidified layer obtained by the droplets flowing on the droplet overlapping solidification layer and continuously being solidified without droplets' impacting center position overlapping.

2. The structure manufacturing apparatus according to claim 1, wherein the structure further includes recessed parts at the boundary region between the droplet overlapping solidified layer and the droplet flowing solidified layer, and a convex part being inclined continuously in the moving direction of the substrate on a side part of the droplet overlapping solidified layer.

3. The structure manufacturing apparatus according to claim 1, wherein a temperature gradient in the temperature region becoming the low temperature on the downstream side in the moving direction of the substrate is 1° C./mm or more and 100° C./mm or less.

4. The structure manufacturing apparatus according to claim 1, wherein a surface temperature of the substrate at the impacting position of the droplet is in a range from 50° C. or more and 200° C. or less.

5. The structure manufacturing apparatus according to claim 1, wherein the temperature profile comprises:
a first temperature region that is a first low temperature region having a decreasing gradient temperature distribution curve toward an upstream side of the moving direction;
a second temperature region maintaining higher temperatures than the first temperature region; and a third temperature region at a center of the impacting position, the third temperature region being lower than the second temperature region, and the third temperature region being a second low temperature region having a decreasing gradient temperature distribution curve toward the downstream side of the moving direction, wherein slopes of the temperature profile at transitions between the first and the second temperature regions and between the second and the third temperature regions are higher than that of the decreasing gradient temperature distribution curve in the first and the third temperature regions.

\* \* \* \* \*